US012707642B2

(12) United States Patent
Lin et al.

(10) Patent No.: US 12,707,642 B2
(45) Date of Patent: Aug. 11, 2026

(54) SEMICONDUCTOR MEMORY DEVICES AND METHODS OF FABRICATING THE SAME

(71) Applicant: Taiwan Semiconductor Manufacturing Company, Ltd., Hsinchu (TW)

(72) Inventors: Meng-Han Lin, Hsinchu (TW); Chia-En Huang, Hsinchu (TW); Sai-Hooi Yeong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 18/169,563

(22) Filed: Feb. 15, 2023

(65) Prior Publication Data

US 2023/0422510 A1 Dec. 28, 2023

Related U.S. Application Data

(60) Provisional application No. 63/420,384, filed on Oct. 28, 2022, provisional application No. 63/356,157, filed on Jun. 28, 2022.

(51) Int. Cl.

*H10B 51/20* (2023.01)
*H10W 20/41* (2026.01)
*H10W 20/42* (2026.01)

(52) U.S. Cl.

CPC ............ *H10B 51/20* (2023.02); *H10W 20/42* (2026.01); *H10W 20/435* (2026.01)

(58) Field of Classification Search

CPC ............... G11C 11/223; H01L 23/5226; H01L 23/5283; H10B 51/10; H10B 51/20; H10B 51/30; H10D 30/701; H10D 64/033; H10W 20/42; H10W 20/435

See application file for complete search history.

(56) References Cited

U.S. PATENT DOCUMENTS 8,638,594 B1 * 1/2014 Sinha ..................... H10B 10/12 257/408
2019/0273167 A1 * 9/2019 Saitoh ............... H01L 21/02123
2020/0091274 A1 * 3/2020 Sharma ................ H10D 64/689

FOREIGN PATENT DOCUMENTS

TW 201826276 A 7/2018
TW 202201742 A 1/2022
TW 202218118 A 5/2022

* cited by examiner

*Primary Examiner* — Meiya Li
(74) *Attorney, Agent, or Firm* — Foley & Lardner LLP

(57) ABSTRACT

A semiconductor device includes a word line (WL) structure. The semiconductor device includes a ferroelectric layer over the WL structure. The semiconductor device includes a channel layer over the ferroelectric layer. The semiconductor device includes a source line (SL) structure over the channel layer. The semiconductor device includes a bit line (BL) structure over the channel layer. The BL structure includes a portion that laterally extends toward the SL structure. The semiconductor device further includes a dielectric layer laterally interposed between the SL structure and the BL structure.

20 Claims, 26 Drawing Sheets

| Oxide breakdown field (MV/cm) | | 1 | 6 |
|---|---|---|---|
| SL/BL applied voltage (V) | 5 | 50 nm | 8.3 nm |
| | 4 | 40 nm | 6.7 nm |
| | 3 | 30 nm | 5 nm |
| | 2 | 20 nm | 3 nm |
| | 1 | 10 nm | 1.7 nm |

104
180
182
174
150
170
160
140
130
110
120
102
Z
X

SEMICONDUCTOR MEMORY DEVICES AND METHODS OF FABRICATING THE SAME

CROSS-REFERENCE TO RELATED APPLICATIONS

The present application claims priority to and the benefit of U.S. Provisional Patent App. No. 63/356,157, filed Jun. 28, 2022, and U.S. Provisional Patent App. No. 63/420,384, filed Oct. 28, 2022, the entire disclosures of which are incorporated herein.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
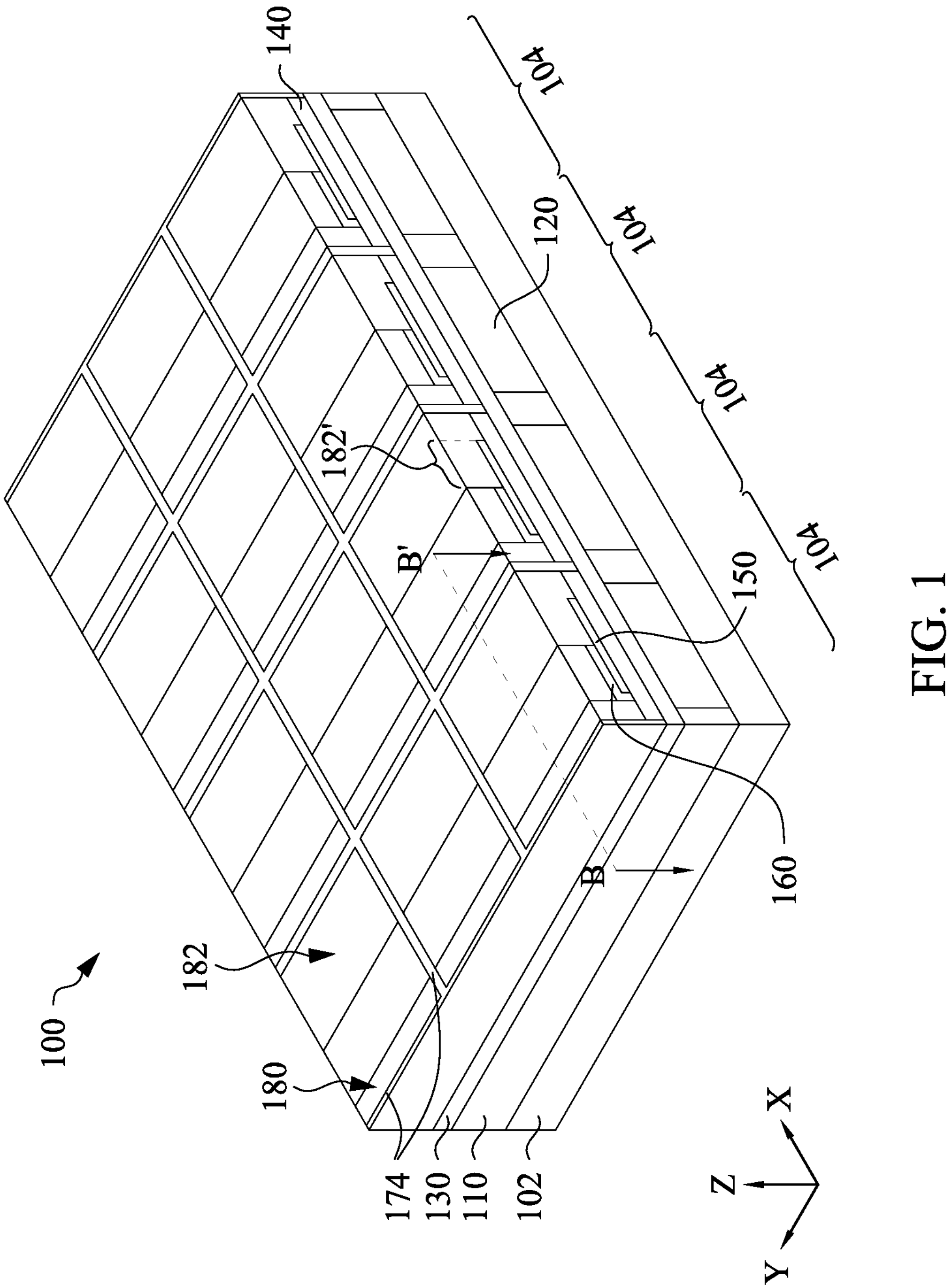
FIG. 1 illustrates a perspective view of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric material refers to a material that displays spontaneous polarization of electrical charges in the absence of an applied electric field. The net polarization P of electrical charges within the ferroelectric material is non-zero in a minimum energy state, causing spontaneous polarization to occur and surface charges of opposite polarity types to accumulate on opposing surfaces of the ferroelectric material. Polarization P of a ferroelectric material as a function of an applied voltage V thereacross displays hysteresis. The product of a remnant polarization ($P_r$) and the coercive field of a ferroelectric material is a metric for characterizing effectiveness of the ferroelectric material.

A ferroelectric memory device is a memory device containing such ferroelectric material to store information. The dipole moment of the ferroelectric material is programmed in two different orientations (e.g., "up" or "down" polarization positions based on atom positions, such as oxygen and/or metal atom positions, in a crystal lattice) depending on the polarity of the applied electric field to the ferroelectric material. The different orientations of the dipole moment of the ferroelectric material may be detected by the electric field generated by the dipole moment of the ferroelectric material.

For example, the ferroelectric memory device may be implemented as transistor structure (e.g., a ferroelectric field-effect transistor, or FeFET), which includes the ferroelectric material vertically interposed between a semiconductor channel and a word line (WL) structure. The WL structure can gate (e.g., modulate) the semiconductor channel to conduct current from a source line (SL) structure to a bit line (BL) structure. The BL and SL structures are vertically disposed opposite the semiconductor channel from the WL structure, which can generally provide a decent channel resistance. For back-end-of-the-line (BEOL)-compatible memory applications, ferroelectric FETs show advantages such as low operation voltage (e.g., less than about 3 V), high-speed switch (e.g., on the scale of ns), excellent endurance (e.g., greater than $10^9$ cycles), and simpler device structures. However, some existing ferroelectric FETs may suffer narrow memory window issues. Thus, the existing ferroelectric memory devices have not been entirely satisfactory in all aspects.

The present embodiments provide memory devices with asymmetric SL/BL structures (e.g., with an extended BL structure) for effectively switching ferroelectric polarization within the semiconductor channel and widening the memory window of the FeFETs.

The present disclosure provides various embodiments of a memory device that utilizes a ferroelectric material as its memory material. In various embodiments, the FeFET includes a WL structure, a ferroelectric layer over the WL structure, a channel layer over the ferroelectric layer, and a source line (SL) structure and a bit line (BL) structure, which function as a source and a drain of the FeFET, respectively, in direct contact with the channel layer. In various embodiments, the ferroelectric layer and the channel layer extend in parallel to the WL structure. In various embodiments, the FeFET further includes a dielectric (e.g., an oxide) layer over the channel layer, such that the SL structure and the BL structure are laterally separated by the dielectric layer. In some embodiments, the FeFET further includes an etch-stop layer (ESL) over the dielectric layer, such that the SL structure and the BL structure are both in direct contact with and separated laterally by the ESL. In some embodiments, a portion of the BL structure extends over and directly contacts a top surface of the dielectric layer while the SL structure is completely separated from the dielectric layer by the ESL. In some embodiments, a portion of the BL structure extends along and directly contacts the top surface of the dielectric layer over a first distance and a portion of the SL structure extends along and directly contacts the top surface of the dielectric layer over a second distance that is less than the first distance. As such, the SL structure and the BL structure are asymmetrically arranged to improve memory window in the FeFET.

FIG. 1 illustrates a perspective view of a memory device 100, according to various embodiments of the present disclosure. It should be understood that the perspective view of FIG. 1 is simplified, and thus, it should be understood that any of various other features/components can also be included in FIG. 1, while remaining within the scope of the present disclosure.

As shown, the memory device 100 includes a number of memory cells 104 arranged as a memory array. It should be appreciated that, in some other embodiments, any number of such memory layers may be stacked on top of one another (e.g., along the Z direction) to form a memory array. Each of the memory cells 104 can include a laterally extending WL structure functioning as a gate to control a laterally extending channel layer through a laterally extending ferroelectric film, and the channel layer, which on the other side of the ferroelectric film, is in electrical contact with a pair of laterally extending SL structure and BL structure, the details of which are discussed below.

For example, in the present embodiments, the memory cell 104 includes a WL structure 120 over a semiconductor substrate 102, wherein the WL structure 120 extends along the Y direction (e.g., four WL structures 120 in four memory cells 104 are shown in the example of FIG. 1). The memory cell 104 further includes a ferroelectric layer 130 in contact with the WL structure 120. As shown, the ferroelectric layer 130 traverses an entirety of the WL structure 120. The memory cell 104 further includes a channel layer 140 electrically coupled to the WL structure 120. In the depicted embodiments, the ferroelectric layer 130 extends continuously across an array of memory cells 104. The memory cell 104 further includes a pair of SL structure 180 and BL structure 182 that each extend along the Y direction. In the present disclosure, the SL structure 180 may be alternatively referred to as a source metal electrode and the BL structure 182 may be alternative referred to as a drain metal electrode. As shown, the channel layer 140, which is coupled to the WL structure 120, is in contact with a corresponding pair of the SL structure 180 and BL structure 182.

In the present embodiments, the SL structure 180 and the BL structure 182 are asymmetric along the X direction. In the depicted embodiments, a protruding portion 182' of the BL structure 182 extends toward the SL structure 180 along the X direction. Furthermore, in contrast to the SL structure 180 having a bottom surface entirely in contact with the channel layer 140, a bottom surface of the protruding portion 182' of the BL structure 182 may be isolated from the channel layer 140 by a portion of a first dielectric layer 150, which is laterally interposed between the SL 180 and the BL 182 along the X direction. In some embodiments, each memory cell 104 further includes an etch-stop layer (ESL) 160 over a portion of the first dielectric layer 150 and a second dielectric layer 170 over the ESL 160. As will be discussed in detail below, the ESL 160 is provided to facilitate the formation of the asymmetric SL and BL structures. In this regard, the ESL 160 and the first dielectric layer 150 differ in composition to ensure sufficient etching selectivity therebetween. In some embodiments, the first dielectric layer 150 is omitted from the memory device 100 such that the ESL 160 directly contacts the channel layer 140. Additionally, the memory device 100 further includes a third dielectric layer 174 that separates adjacent memory cells 104 along both the X direction and the Y direction. Furthermore, in some embodiments, the third dielectric layer 174 extends along the Z direction to stop on the ferroelectric layer 130. A fourth dielectric layer 110, the first dielectric layer 150, the second dielectric layer 170, and the third dielectric layer 174 may include the same dielectric material or may differ in composition.

Each memory cell 104 of the memory device 100 may be defined as a combination of one of the WL structures 120, a portion of the ferroelectric layer 130, the channel layer 140, and one pair of SL structure 180 and BL structure 182. Such a memory cell may be implemented as a transistor structure (sometimes referred to as a "one-transistor (1T) structure") with a gate, a gate oxide/dielectric layer, a semiconductor channel, a source, and a drain. The WL structure 120, the ferroelectric layer 130, the channel layer 140, the SL structure 180, and the BL structure 182 may function as a gate, a gate dielectric layer, a semiconductor channel, a source, and a drain of the memory cell 104, respectively.

Figures 2A, 2B:
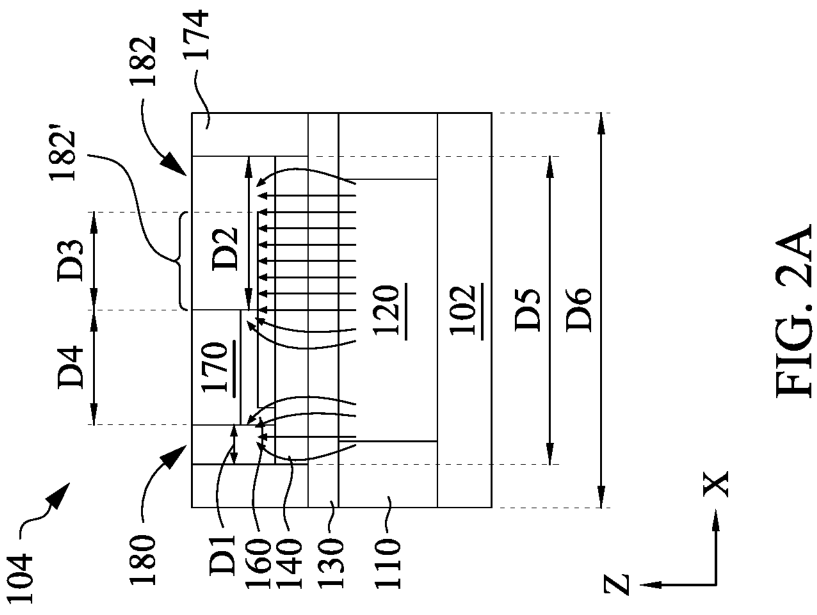
FIG. 2A illustrates a cross-sectional view along line BB' of a portion of the example memory device as shown in FIG. 1, in accordance with some embodiments.
FIG. 2B illustrates an example set of data correlating a dimension of a portion of the example memory device as shown in FIG. 2A with applied voltage, in accordance with some embodiments.

Referring to FIG. 2A, a cross-sectional view along line BB' of a memory cell 104 as shown in FIG. 1, details of the asymmetric SL and BL structures are depicted. In some embodiments, the asymmetry is attributed to the disparity between the dimensions of the SL structure 180 and the BL structure 182. For example, the SL structure 180 may be defined by a width D1 and the BL structure 182 (or the widest portion thereof) may be defined by a width D2 along the X direction, where D2 is greater than D1. In some embodiments, the asymmetry is attributed to the disparity between the shapes of the SL structure 180 and the BL structure 182. For example, the SL structure 180 includes two parallel, or substantially parallel, sidewalls from top to bottom of the SL structure 180, whereas a sidewall of the BL structure 182 that faces the SL structure 180 includes a step profile formed by the protruding portion 182'. The protruding portion 182', which may be defined by a width D3, interfaces with the ESL 160 and the second dielectric layer 170 along one sidewall and interfaces with the first dielectric layer 150 along a bottom surface. In contrast, an entirety of a bottom surface of the SL structure 180 directly contacts the channel layer 140. As shown, the second dielectric layer 170 separating the SL structure 180 and the BL structure 182 may be defined by a width D4, such that a channel length D5 along the X direction may be defined by a sum of D1, D2, and D4. For embodiments in which the third dielectric layer 174 stops on the ferroelectric layer 130, a portion of the ferroelectric layer 130 within each memory cell 104 may be defined by a width D6 that is greater than D5.

In the present embodiments, a minimum value of D4 is determined based on the material selection for the second dielectric layer 170 and a voltage applied to the memory device 100. For a given applied voltage, the minimum value of D4 required to maintain device integrity and avoid oxide breakdown decreases, i.e., the SL structure 180 and the BL structure 182 may be placed closer to one another, as the oxide breakdown field value increases. This is demonstrated by an example table in FIG. 2B where, for each of the two example oxide breakdown field values at 1 MV/cm and 6 MV/cm, the minimum value of D4 decreases as the applied voltage decreases from 5 V to 1 V. In this regard, the material included in the second dielectric layer 170 may be selected based on a range of applied voltage according to design requirements.

Figure 3:
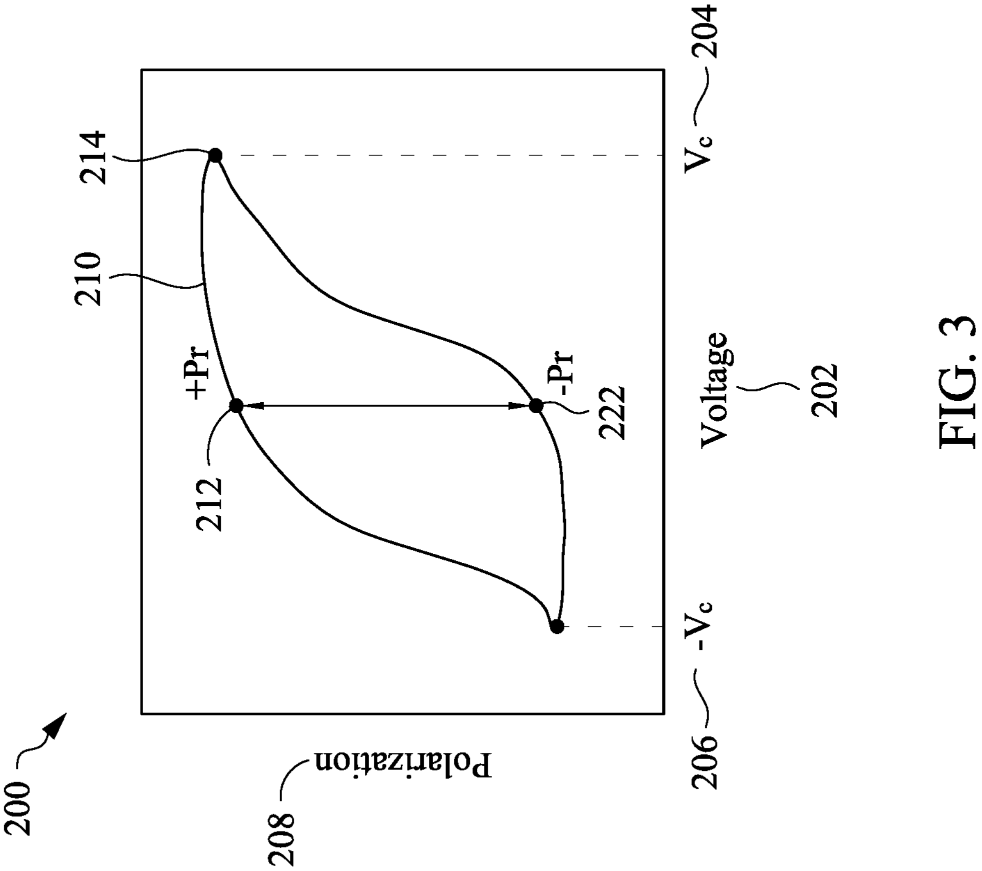
FIG. 3 illustrates an example polarization-voltage curve associated with a ferroelectric film of an example memory device, in accordance with some embodiments.

FIG. 3 depicted is an example PV curve 200 associated with a ferroelectric film (e.g., the ferroelectric layer 130), in accordance with some embodiments. The application of a coercive voltage (i.e., $V_C$) across electrodes of the ferroelectric film may result in polarization of the ferroelectric film. For example, the coercive voltage may be applied as a sweeping voltage across the corresponding WL structure (e.g., the WL structure 120) and corresponding BL/SL structures (e.g., the SL structure 180 and the BL structure 182). The voltage axis 202 may be centered around any voltage, but in some embodiments will be centered around 0 volts and FIG. 3 will be referred to as such.

Applying a positive voltage, such as $V_C$ 204, to the ferroelectric film (e.g., a positive voltage applied to the WL structure with the BL/SL structures tied to ground) may saturate the polarization of the device, illustrated by a saturation point 214 on the PV curve 200, such that additional voltage may not result in substantial additional polarization. Applying another voltage (e.g., a voltage twice the magnitude of $V_C$) may result in a breakdown of the dielectric properties of the ferroelectric film and such voltage may be considered the $V_{BD}$ for the ferroelectric film. In some embodiments, $V_{BD}$ may be very close to $V_C$ in magnitude. In some embodiments, the voltage of the saturation point 214 may exceed that of $V_{BD}$, where a $V_C$ of lesser amplitude than the saturation voltage may be selected to avoid breakdown of the ferroelectric film. In some embodiments where $V_{BD}$ exceeds the saturation voltage, a $V_C$ may be selected in excess of the magnitude of the voltage of the saturation point 214. Adjusting the applied $V_C$ 204 upward (i.e., approaching or exceeding the saturation point 214) may ensure a complete polarization of the device, which may result in increased performance and/or reliability, and adjusting the amplitude of the applied $V_C$ 204 downward (i.e., increasing a margin to $V_{BD}$) may increase the device's longevity by avoiding electro-migration failures, for example.

Following the application of $V_C$ 204 to the ferroelectric film (e.g., by applying the voltage to two electrodes disposed on opposite sides of the film), $V_C$ may be removed from the ferroelectric film. For example, the circuit may be opened, and the charges disposed along the two electrodes may gradually leak to normalize the voltage, or the ferroelectric film may be grounded (i.e., a ground voltage may be applied thereto). Upon reaching a ground state, the PV curve 200 may relax to a positive polarization point 212 (i.e., along the upper surface 210 of the PV curve 200). The application of a lower or higher voltage may result in a somewhat lower or higher polarization. Thus, the application of a plurality of magnitudes of $V_C$ may result in a plurality of respective positive polarization point 212 values along a polarization axis 208. A plurality of discrete bit values, or a continuous value (e.g., an analog value or an undefined value used to generate random numbers) may be stored on the ferroelectric film. In some embodiments, a voltage may be applied to the ferroelectric film for an insufficient time to complete polarization, and thus polarization may also be controlled.

Application of a negative $V_C$ 206 may polarize the ferroelectric film to a negative polarization point 222 when in a relaxed (e.g., ground) state. In some embodiments, the negative polarization point 222 and positive polarization point 212 may correspond to a logical bit "1" and logical bit "0," respectively. In some embodiments, the ferroelectric film may be symmetrical or substantially symmetrical, wherein the magnitude of $V_C$ 204 and $-V_C$ 206 may be equal or substantially equal, whereas in other embodiments, the magnitude of $V_C$ 204 may be substantially higher or lower than the magnitude of $-V_C$ 206. In such embodiments, $V_C$ may be applied directly to the ferroelectric film, and the difference in magnitude between $V_C$ 204 and $-V_C$ 206 may be due to intrinsic properties of the ferroelectric film. Alternatively or additionally, asymmetries between $V_C$ 204 and $-V_C$ 206 may be a result of additional circuit elements, such as a current sense resistors, capacitors, protection diodes, etc., which $V_C$ 204/or and $-V_C$ 206 may be applied to. Although $V_C$ 204 and $-V_C$ 206 may vary in amplitude and may comprise many values, $V_C$ may be referred to generally herein, as to relate to any coercive voltage which may be intended to adjust the polarization of the ferroelectric film (e.g., a positive or negative value).

Figure 4:
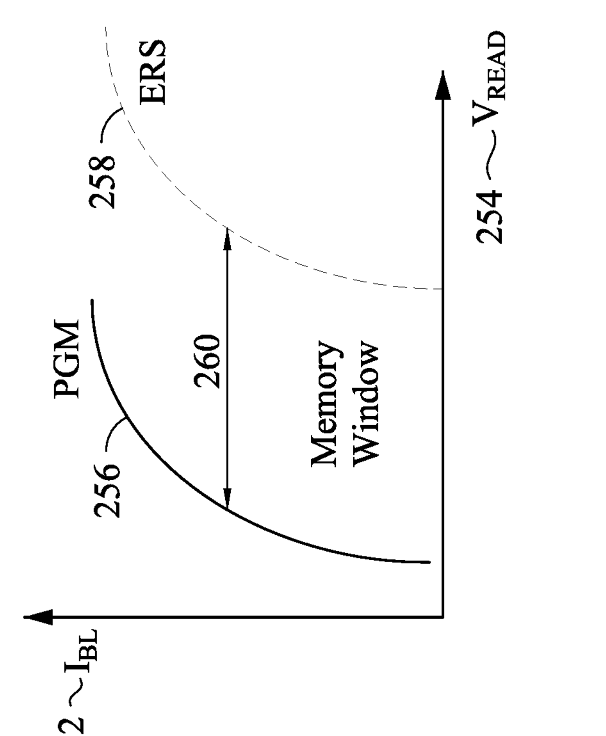
FIG. 4 illustrates an example I-V curve associated with a ferroelectric film of an example memory device, in accordance with some embodiments.

FIG. 4 illustrates an example I-V curve 250 of a memory device (e.g., the memory device 100), where $I_{BL}$ 252 is plotted against $V_{read}$ 254. Curve 256 describes the I-V relationship of the memory device in a programmed (PGM) state, while curve 258 describes the I-V relationship of the memory device in an erased (ERS) state. The displacement in values of the $V_{read}$ 254 between the curve 256 and the curve 258 reflects a memory window 260 of the ferroelectric layer. When an SL structure and a BL structure have the same, i.e., symmetric, structures, there may be less fringing electric field experienced by the SL/BL structures to switch ferroelectric polarization within the channel layer in response to an applied voltage, leading to a narrower memory window 260 and a longer read speed (e.g., longer time needed to distinguish between the PGM and the ERS states). In the present embodiments, the asymmetric extension of the BL structure 182 relative to the SL structure 180 along the X direction leads to more fringing electric field (as illustrated by field lines in FIG. 2A) and thus greater disparity in the ferroelectric polarization within the channel layer between the source node (corresponding to the SL structure 180) and the drain node (corresponding to the BL structure 182), resulting in a widened memory window 260 and improved the read speed.

Figure 5B:
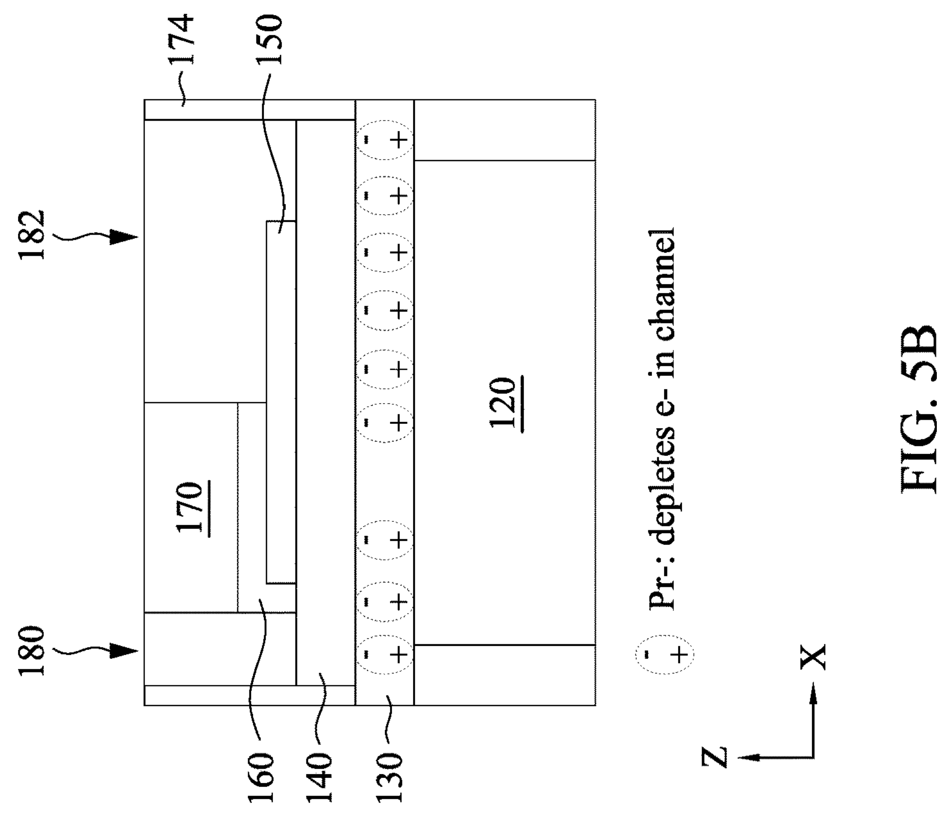
FIGS. 5A and 5B illustrate cross-sectional views along line BB' of a portion of the example memory device as shown in FIG. 1 corresponding to data points on the example I-V curve as shown in FIG. 4, in accordance with some embodiments.
Figure 5A:
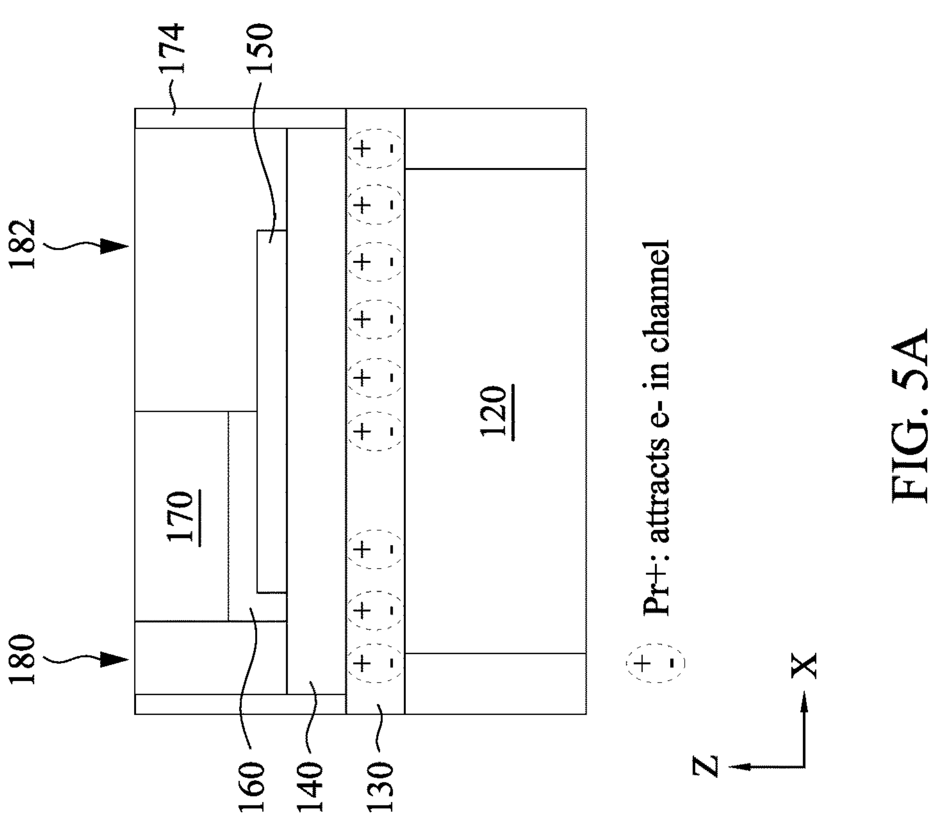

Such disparity between the SL structure 180 and the BL structure 182 may be illustrated in FIGS. 5A and 5B, which correspond to the memory device 100 in the PGM state and the ERS state, respectively. In the case of the PGM state, the polarized ferroelectric layer 130 (i.e., having a positive remnant polarization, $P_r^+$) attracts electrons in the channel layer 140, and in the case of the ERS state, the polarized ferroelectric layer 130 (i.e., having a negative remnant polarization, $P_r^-$) depletes electrons in the channel layer 140. The difference in the extent of attraction or depletion may be attributed to the asymmetric structures of the SL structure 180 and the BL structure 182 as shown. In some embodiments, the asymmetric SL/BL structures provided herein allows the memory device be used in high-density applications.

Figure 6:
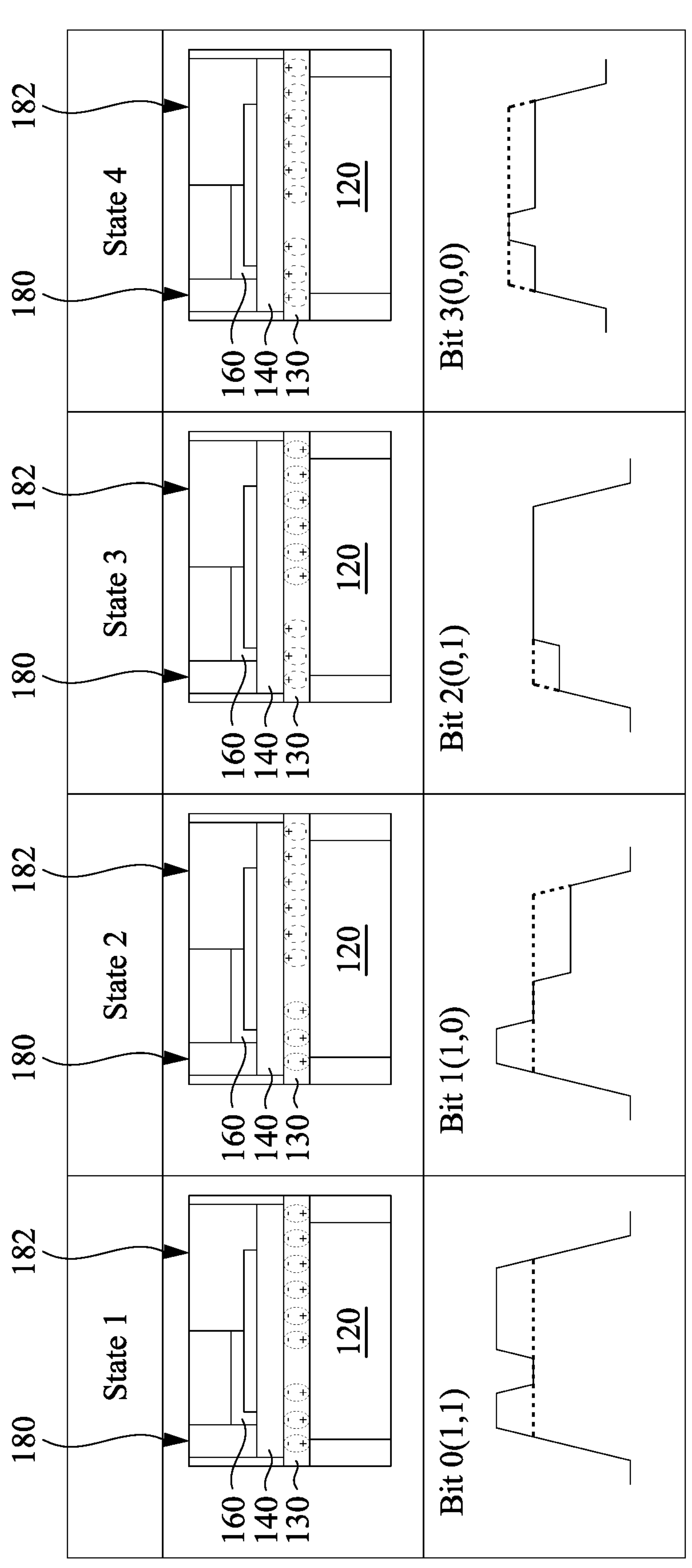
FIG. 6 illustrates cross-sectional views along line BB' of a portion of the example memory device as shown in FIG. 1 at different memory states, in accordance with some embodiments.

The switching of polarization in the channel layer 140 between different memory states is further illustrated in various waveforms of FIG. 6. For example, referring to the waveform corresponding to State 1, which displays the ERS state of FIG. 5A, both the SL structure 180 and the BL structure 182 are in higher threshold voltage ($V_t$) state due to the depletion of electrons in the channel layer 140. Although a higher voltage may be applied to one of the SL structure 180 and the BL structure 182 and 0 V may be applied to the other one to screen the impact of the higher $V_t$, it is observed that one of them has a higher $V_t$ to limit channel current.

Referring to the waveform corresponding to State 2, only the SL structure 180 is in higher $V_t$ state due to the depletion of electrons in the channel layer 140. In this instance, applying higher voltage to the BL structure 182 and 0 V to the SL structure 180 allows the response of the SL structure 180 be sensed. Because the SL structure 180 is in the higher $V_t$ state, applying the higher voltage leads to a lower channel current. Contrarily, a higher channel current is resulted when a higher voltage is applied to the SL structure 180 and 0 V is applied to the BL structure 182 because the higher $V_t$ of the SL structure 180 is screened by the higher applied voltage.

Referring to the waveform corresponding to State 3, only the BL structure 182 is in a higher Vt state due to the depletion of electrons in the channel layer 140. In this instance, applying higher voltage to the SL structure 180 and 0 V to the BL structure 182 allows the response of the BL structure 182 be sensed. Because the BL structure 182 is in the higher $V_t$ state, applying the higher voltage leads to a lower channel current. Contrarily, normal channel current is resulted when a higher voltage is applied to the BL structure 182 and 0 V is applied to the SL structure 180 because the higher $V_t$ of the BL structure 182 is screened by the higher applied voltage.

Referring to the waveform corresponding to State 4, which displays the PGM state of FIG. 5B, both the SL structure 180 and the BL structure 182 are in lower $V_t$ state due to the attraction of electrons in the channel layer 140. A higher voltage may be applied to either one of the SL structure 180 and the BL structure 182, and the other one remains in a lower $V_t$ state. Accordingly, the channel current is higher to reflect the PGM states.

Various embodiments of the memory device 100 are discussed in subsequent FIGS. 7-15C, which depict cross-sectional views along line BB' of a memory cell 104 as shown in FIG. 1, and FIGS. 16-18, which depict top views of an array of memory cells 104 in the X-Y plane. It is noted that various embodiments depicted in FIGS. 7-18 may be combined in accordance with specific design requirements.

Figure 7:
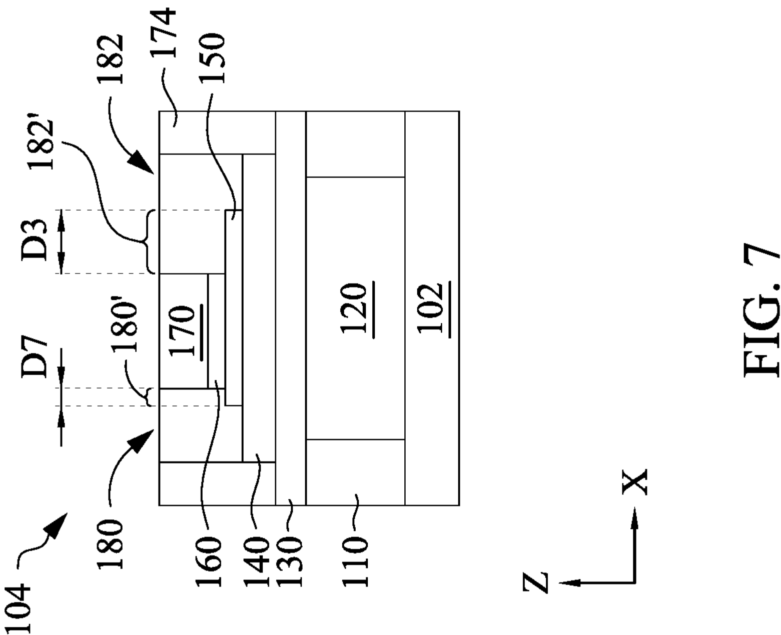

In some embodiments, referring to FIG. 7, in addition to the BL structure having the protruding portion 182', the SL structure 180 also includes a protruding portion 180' that extends toward the BL structure 182 along the X direction. In some embodiments, the protruding portion 180' extends over a portion of the first dielectric layer 150 to form a step profile. In some embodiments, the protruding portion 180' is defined by a width D7 that is less than D3. In other words, the asymmetric configuration of the SL structure 180 and the BL structure 182 is maintained.

Figure 8:
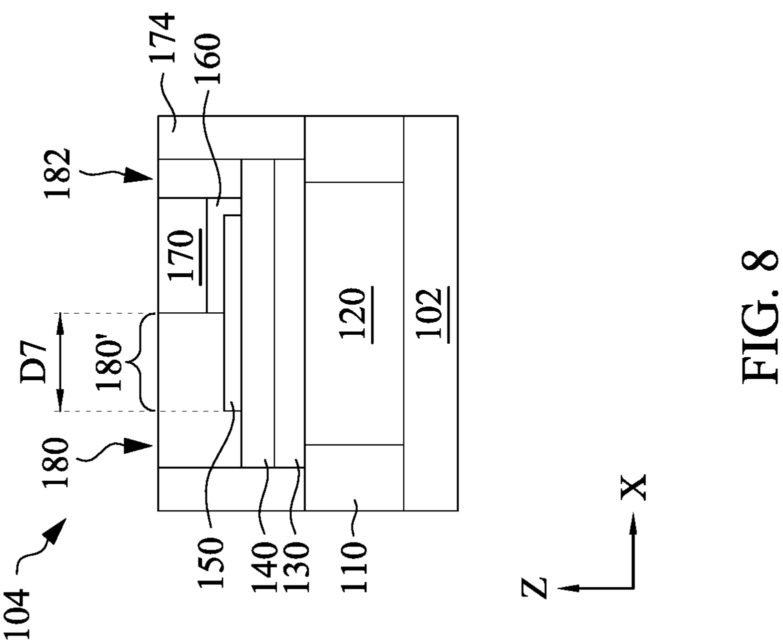
FIGS. 7, 8, 9 10, 11, 12, 13, 14, 15A, 15B, and 15C illustrate cross-sectional views along line BB' of a portion of an example memory device, in accordance with some embodiments.

In some embodiments, referring to FIG. 8, only the SL structure 180 includes the protruding portion 180' while the BL structure 182 is free of any protrusion. In other words, the sidewalls of the BL structure 182 are parallel, or substantially parallel, from top to bottom of the BL structure 182. Accordingly, comparing to the embodiment depicted in FIGS. 1 and 2A, for example, the asymmetric configuration is reversed between the SL structure 180 and the BL structure 182.

Figure 9:
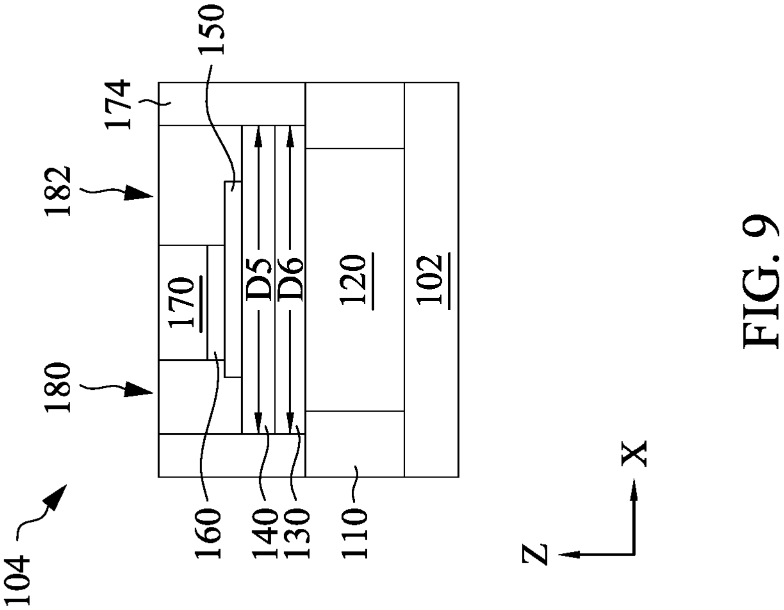
Figure 26B:
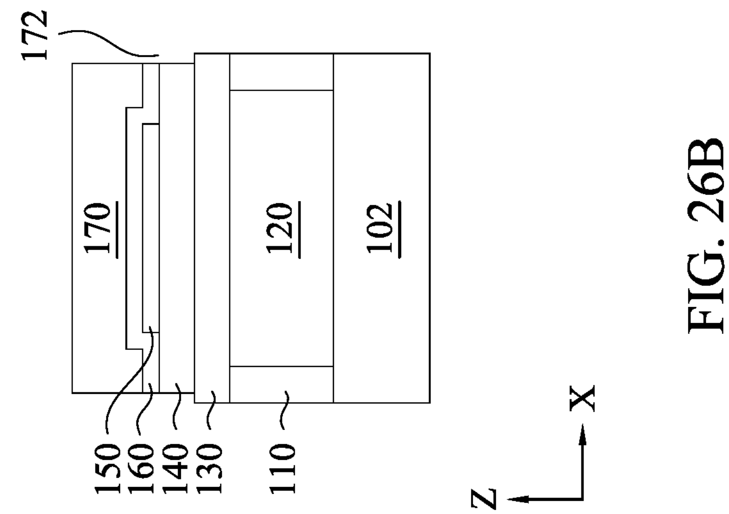
Figure 26A:
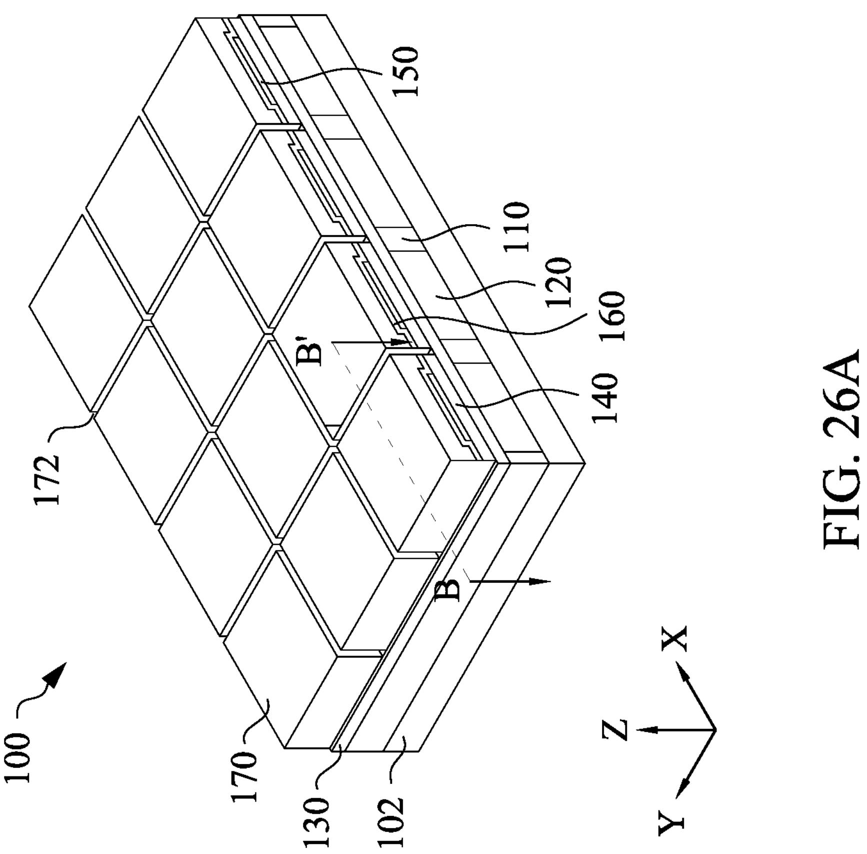

In some embodiments, referring to FIG. 9, the third dielectric layer 174 separating (or isolating) adjacent memory cells 104 extends along the Z direction to contact the fourth dielectric layer 110. In this regard, instead of extending continuously along the X direction across multiple memory cells 104, the ferroelectric layer 130 is truncated by portions of the third dielectric layer 174, such that the third dielectric layer 174 directly contacts sidewalls of the SL/BL structure, the channel layer 140, and the ferroelectric layer 130. Accordingly, the width D5 of the channel layer 140 is substantially the same as the width D6 of the ferroelectric layer 130. In some instances, such configuration may be caused by an over-etching of isolation trenches (e.g., trenches 172 as depicted in FIGS. 26A and 26B) through the ferroelectric layer 130.

Figure 10:
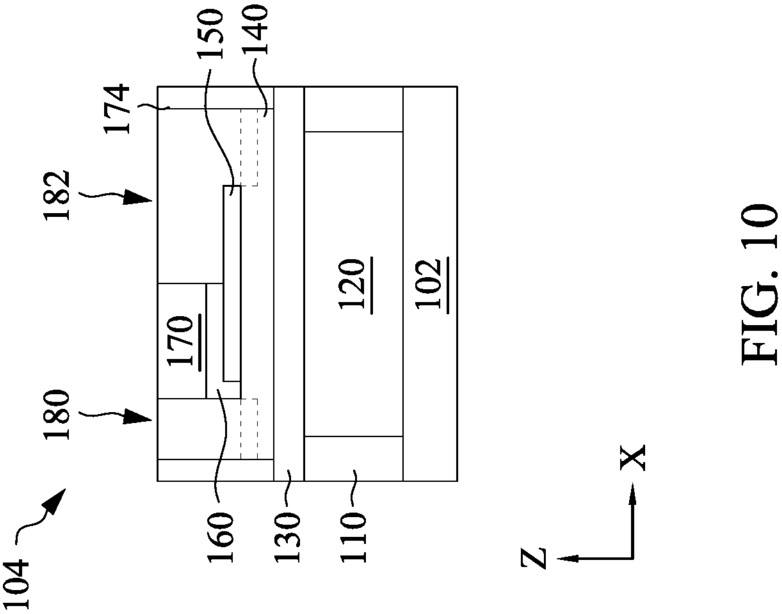

In some embodiments, referring to FIG. 10, portions (as indicated by the dotted enclosure) the SL structure 180 and the BL structure 182 extend to below a top surface of the channel layer 140, such that sidewalls of the channel layer 140 each include a step profile. In some instances, such configuration may be caused by an over-etching of the ESL 160 during a patterning process.

Figure 11:
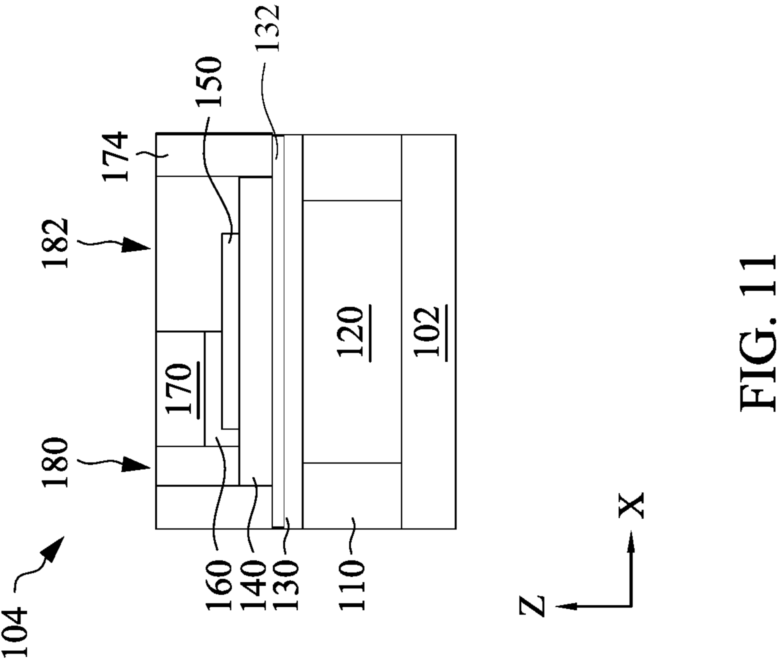
Figure 14:
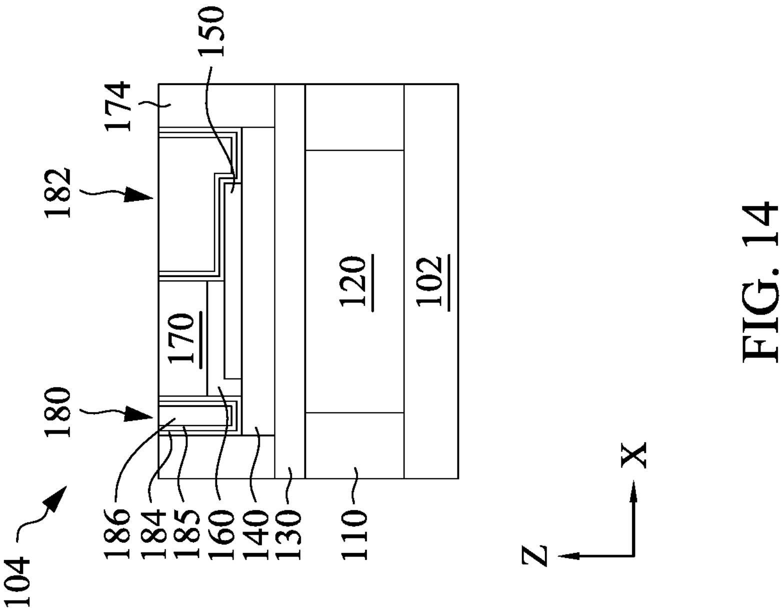

In some embodiments, referring to FIG. 11, the memory cell 104 includes another ferroelectric layer 132 over the ferroelectric layer 130, where the ferroelectric layers 130 and 132 differ in composition. By combining ferroelectric properties of dissimilar materials, the overall switching stability of the memory device 100 may be enhanced.

Figure 12:
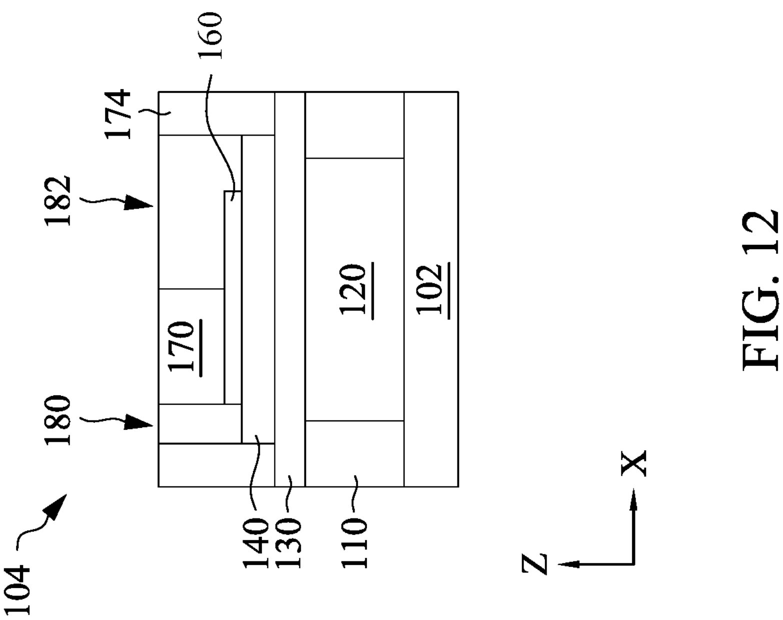

In some embodiments, referring to FIG. 12, the first dielectric layer 150 is omitted from the structure of the memory cell 104, such that an entirety of the ESL 160 directly contacts the top surface of the channel layer 140. Additionally, the absence of the first dielectric layer 150 removes a vertical portion of the ESL 160 that is otherwise present along a sidewall of the first dielectric layer 150.

Figure 13:
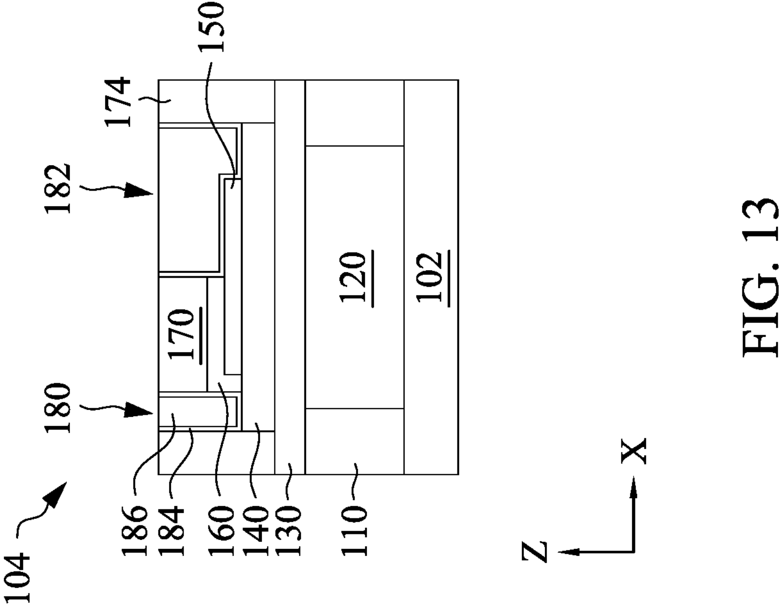

In some embodiments, each of the SL structure 180 and the BL structure 182 includes a multi-layer structure. Referring to FIG. 13, for example, the SL structure 180 and the BL structure 182 each include a metal fill layer 186 over an adhesive layer (or glue layer) 184. Alternatively, referring to FIG. 14, the SL structure 180 and the BL structure 182 each further include an ohmic contact layer 185 disposed between the metal fill layer 186 and the adhesive layer 184.

In the present embodiments, the adhesive layer 184 and the metal fill layer 186 both include at least one conductive material but differ in composition. The adhesive layer 184 and the metal fill layer 186 may each include Mo, Ti, Pd, W, Co, Cr, Cu, Ni, Ta, Pt, Au, Al, TiW, TiN, TaN, WN, WCN, other suitable conductive materials, or combinations thereof. The ohmic contact layer 185 may include a highly doped oxide semiconductor material, such as indium tungsten oxide (IWO), indium zinc oxide (IZO), indium tungsten zin oxide (IWZO), indium tin zinc oxide (ITZO), indium tin oxide (ITO), indium oxide (InO), indium gallium zinc oxide (IGZO), indium gallium oxide (IGO), other suitable oxide semiconductor materials, or combinations thereof.

Figures 15A, 15B, 15C:
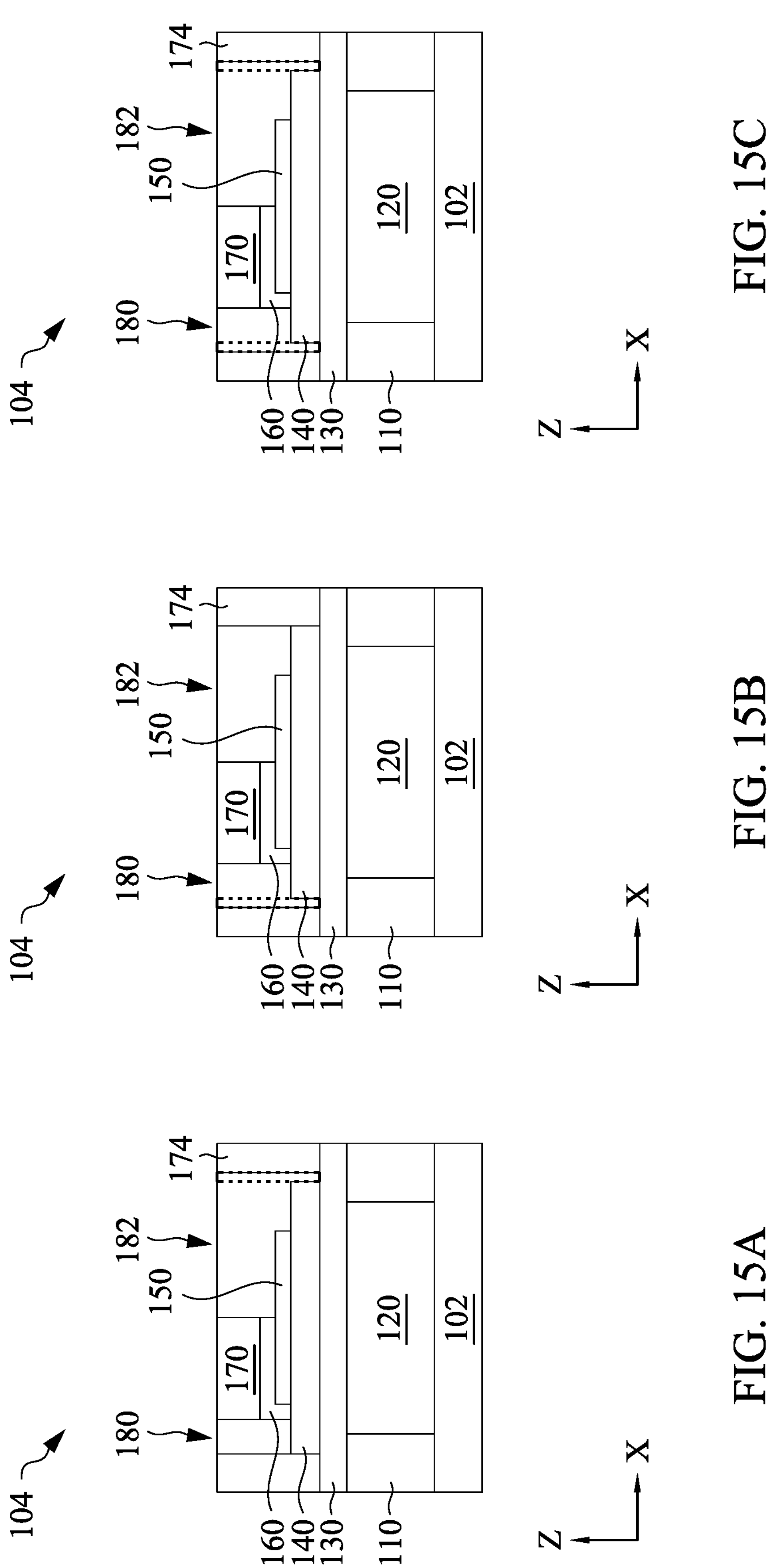

In some embodiments, referring to FIGS. 15A-15C collectively, a portion of the BL structure 182 (see FIG. 15A), the SL structure 180 (see FIG. 15B), or both (see FIG. 15C), extends (i.e., overhangs) over a sidewall of the channel layer 140, such that the sidewall of the channel layer 140 is separated from the third dielectric layer 174. In some instances, the overhung portions (each indicated by the dotted enclosure) of the SL structure 180 and/or the BL structure 182 may be caused by inadvertent overlay error and/or over-etching during a patterning process for forming the SL structure 180 and the BL structure 182.

Figure 16:
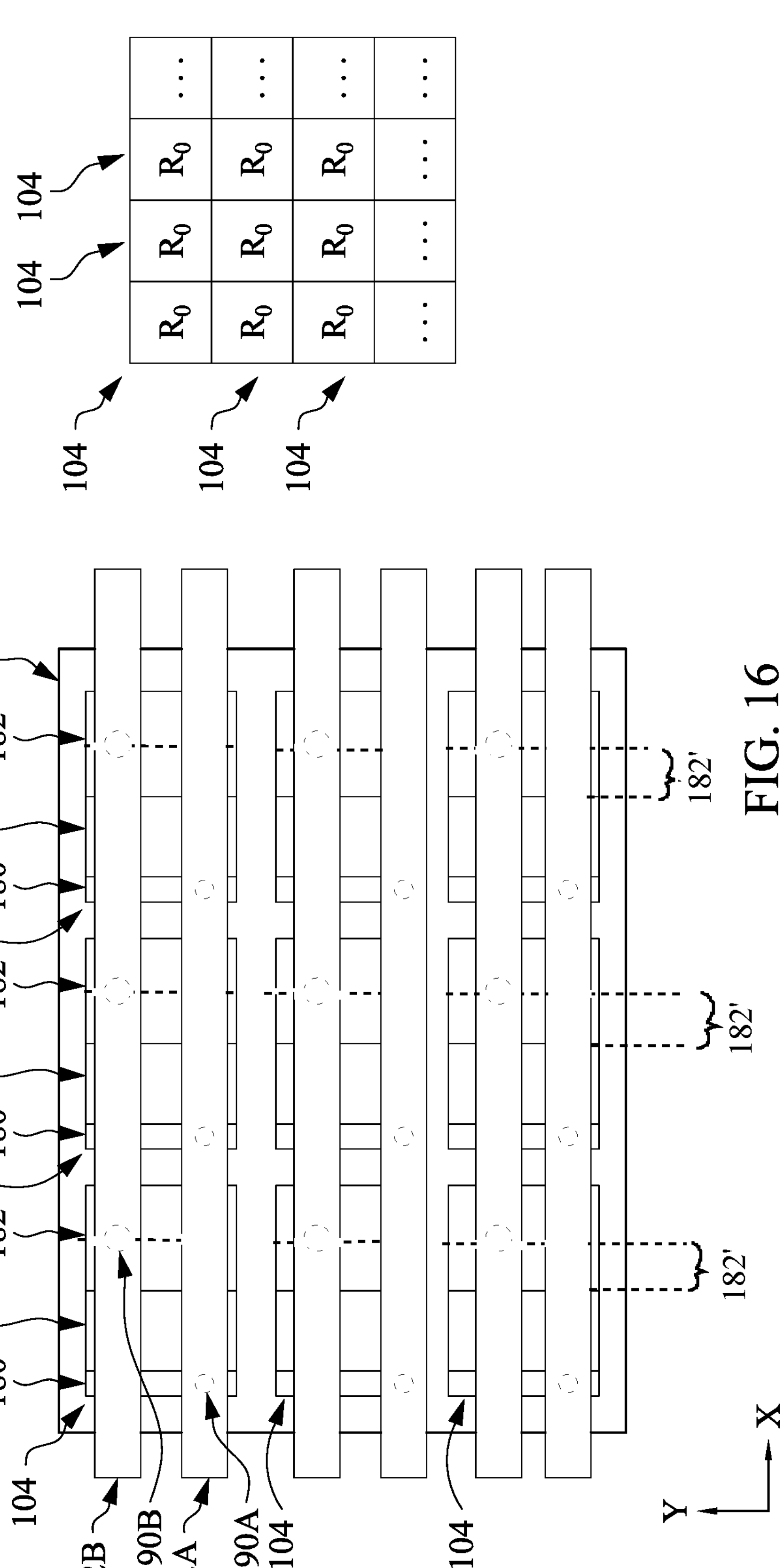
FIGS. 16, 17, and 18 illustrate planar top views of a portion or an entirety of an example memory device, in accordance with some embodiments.
Figure 17:
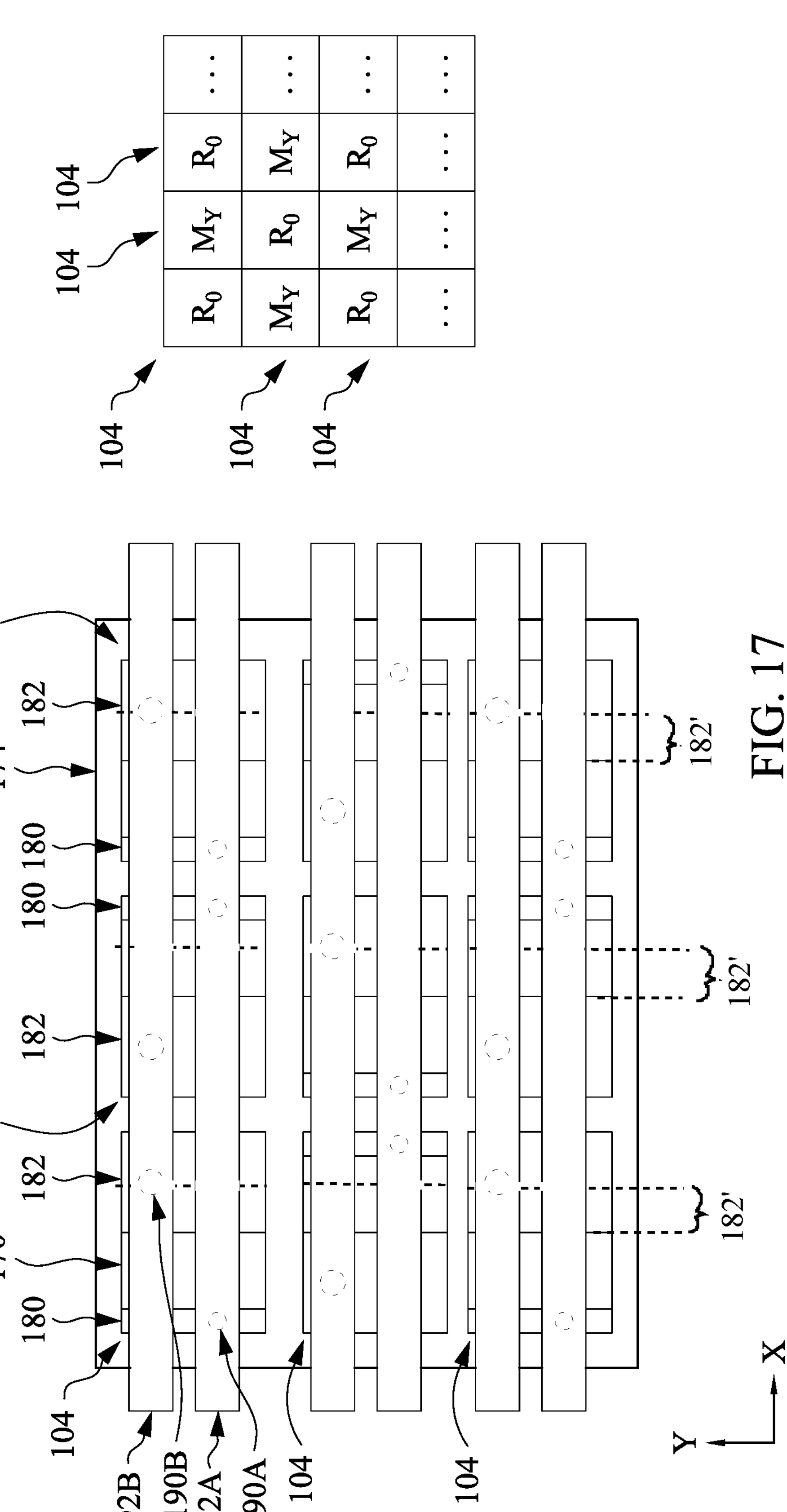
Figure 18:
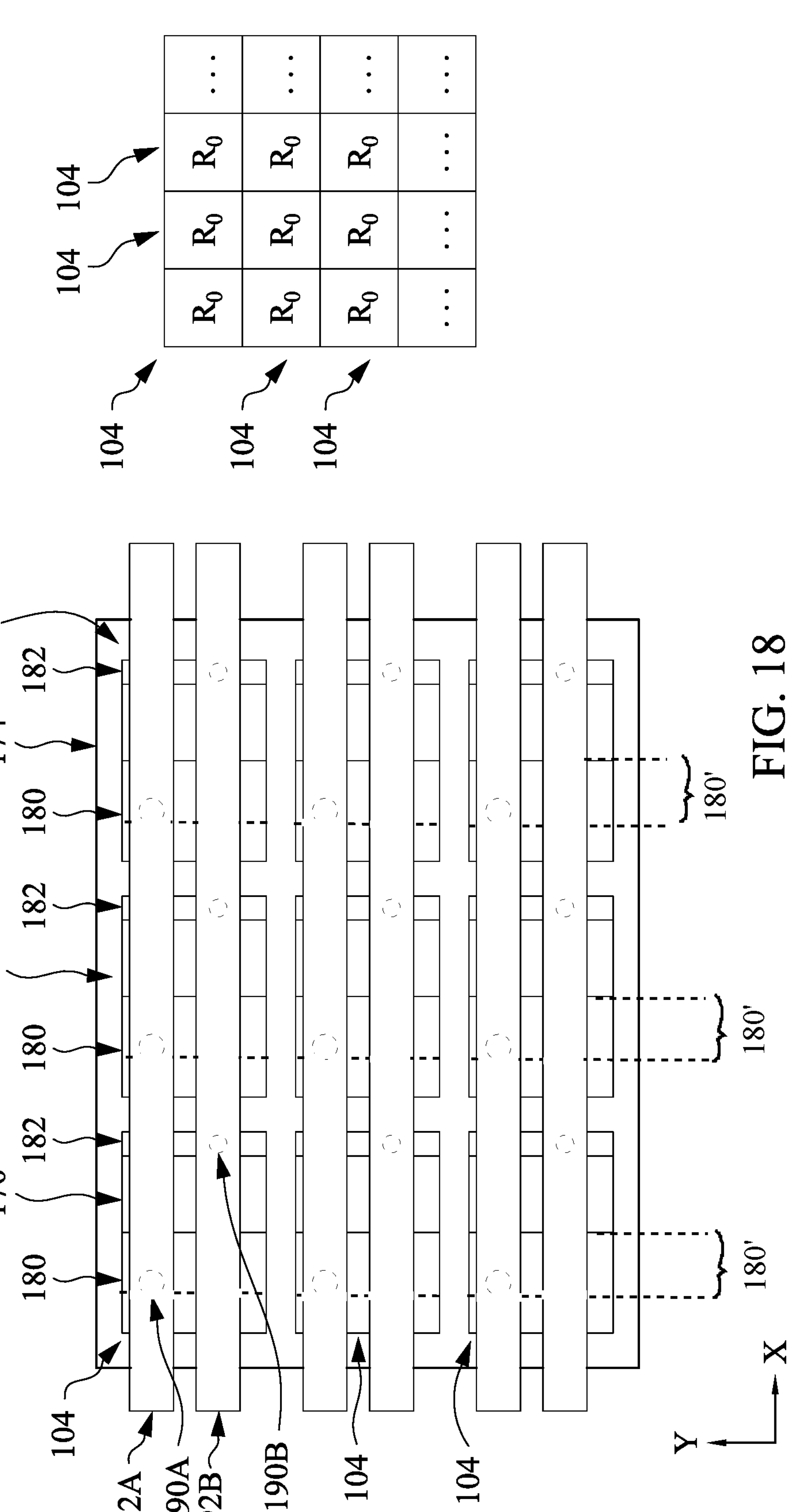

Referring to FIGS. 16-18 collectively, which illustrate top views of a portion of the memory device 100 in the X-Y plane, the present disclosure provides various embodiments in which the array of memory cells 104 may be arranged to form the memory device 100. Referring to FIG. 16, for example, the memory device 100 includes an array of repeating memory cells 104 having the same orientation (e.g., the orientation depicted in FIG. 2A), denoted by $R_0$.

Referring to FIG. 17, the memory device 100 alternatively includes an array of memory cells 104 having a staggered, or "checkerboard," arrangement. In the depicted embodiment, two adjacent memory cells 104 disposed along the X direction have a mirror symmetry about the Y direction. For example, using the $R_0$ as the original orientation for a first memory cell 104, a second memory cell 104 adjacent the first memory cell 104 along the X direction is flipped along the Y direction such that the cells are mirror images of each other, and the orientation of the second memory cell 104 is therefore denoted by $M_Y$.

In some embodiments, due to the asymmetric SL/BL structures, a staggered arrangement allows more compact placement of the memory cells 104 to improve processing windows for subsequent fabrication processes, such as a lithography patterning process. In an alternative embodiment and corresponding to FIG. 8, FIG. 18 depicts each memory cell 104 including the SL structure 180 with the protruding portion 180', and the memory device 100 includes an array of the memory cells 104 each placed in the $R_0$ orientation.

Still referring to FIGS. 16-18, a plurality of interconnect structures 190A, 190B, 192A, and 192B are shown to be disposed over the memory cells 104. The interconnect structures 190A and 190B are vertical interconnect structures (i.e., vias) configured to connect the SL structure 180 and the BL structure 182, respectively, with interconnect structures 192A and 192B, which are horizontal interconnect structures (i.e., conductive lines). Due to the asymmetric nature of the SL/BL structures, a cross-sectional area of the interconnect structure 190A may differ from a cross-sectional area of the interconnect structure 190B. For example, referring to FIGS. 16 and 17, the interconnect structure 190B connected to the BL structure 182 with the protruding portion 182' has a larger cross-sectional area (indicated by a relatively larger dotted circle) than the interconnect structure 190A connected to the SL structure 180. Similarly, referring to FIG. 18, the interconnect structure 190A connected to the SL structure 180 with the protruding portion 180' has a larger cross-sectional area than the interconnect structure 190B connected to the BL structure 182.

Figure 19:
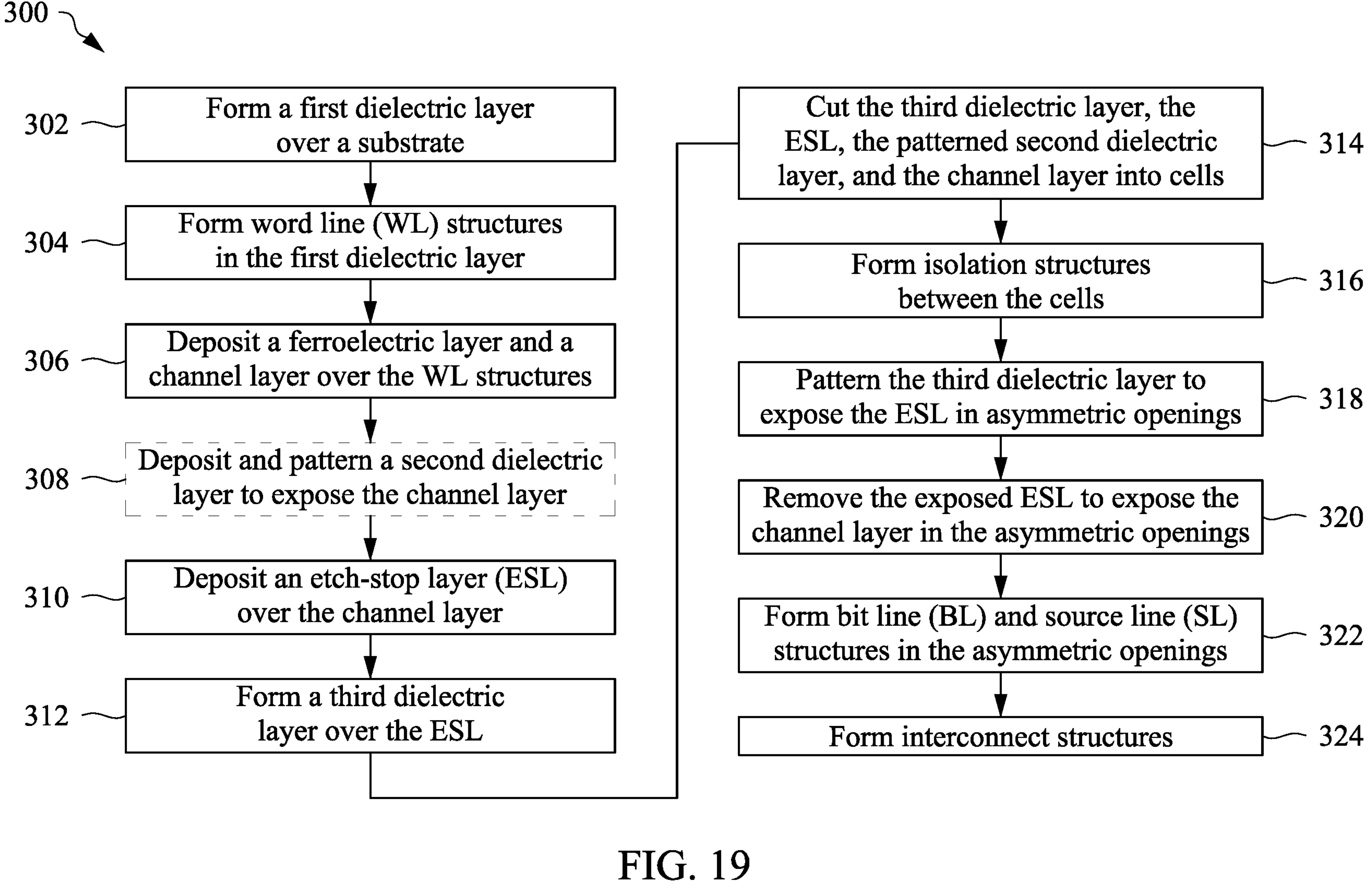
FIG. 19 is an example flow chart of a method for fabricating an example memory device, in accordance with some embodiments.

FIG. 19 illustrates a flowchart of a method 300 to form a memory device, according to various embodiments of the present disclosure. For example, at least some of the operations (or steps) of the method 300 can be performed to fabricate, make, or otherwise form a memory device (e.g., the memory device 100 of FIG. 1). The method 300 is merely an example, and is not intended to limit the present disclosure. Accordingly, it should be understood that additional operations may be provided before, during, and after the method 300 of FIG. 19, and that some other operations may only be briefly described herein.

In various embodiments, operations of the method 300 may be associated with perspective views of an example memory device 100 at various fabrication stages as shown in FIGS. 20A-31B, where FIGS. 20A, 21A, 22A, 23A, 24A, 25A, 26A, 27A, 28A, 29A, 30A, and 31A are three-dimensional perspective views of the memory device 100, and FIGS. 20B, 21B, 22B, 23B, 24B, 25B, 26B, 27B, 28B, 29B, 30B, and 31B are cross-sectional views along line BB' of a portion of the memory device 100 as shown in their corresponding perspective views.

In brief overview, the method 300 starts with operation 302 of forming a first dielectric layer over a semiconductor substrate. The method 300 proceeds to operation 304 of forming the word line (WL) structures 120. The method 300 continues to operation 306 of depositing the ferroelectric layer 130 and the channel layer 140 over the WL structures 120. The method 300 continues to an optional operation 308 of depositing and patterning the first dielectric layer 150 to expose the channel layer 140. The method 300 continues to operation 310 of depositing the etch-stop layer (ESL) 160 over the patterned first dielectric layer 150. The method 300 continues to operation 312 of forming the second dielectric layer 170 over the ESL 160. The method 300 continues to operation 314 of isolating the second dielectric layer 170, the ESL 160, the patterned first dielectric layer 150, and the channel layer 140 into memory cells 104. The method 300 continues to operation 316 of forming the third dielectric layer 174 between the memory cells. The method 300 continues to operation 318 of patterning the second dielectric layer 170 to expose the ESL 160. The method 300 continues to operation 320 of removing the exposed ESL 160 to expose the channel layer 140 in asymmetric openings. The method 300 continues to operation 322 of forming a number of the bit line (BL) structures 182 and a number of the source line (SL) structures 180 in the asymmetric openings. The method 300 continues to operation 324 of forming a number of the interconnect structures 190A, 190B, 192A, and 192B. The method 300 may include additional fabrication steps following operation 324.

Figure 20B:
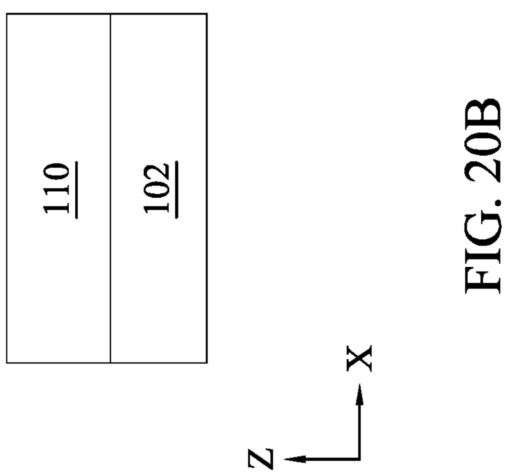
FIGS. 20B, 21B, 22B, 23B, 24B, 25B, 26B, 27B, 28B, 29B, 30B, and 31B illustrate cross-sectional views along line BB' of the example memory device as shown in FIGS. 20A, 21A, 22A, 23A, 24A, 25A, 26A, 27A, 28A, 29A, 30A, and 31A, respectively, during various fabrication stages of the method illustrated in FIG. 19, in accordance with some embodiments.
Figure 20A:
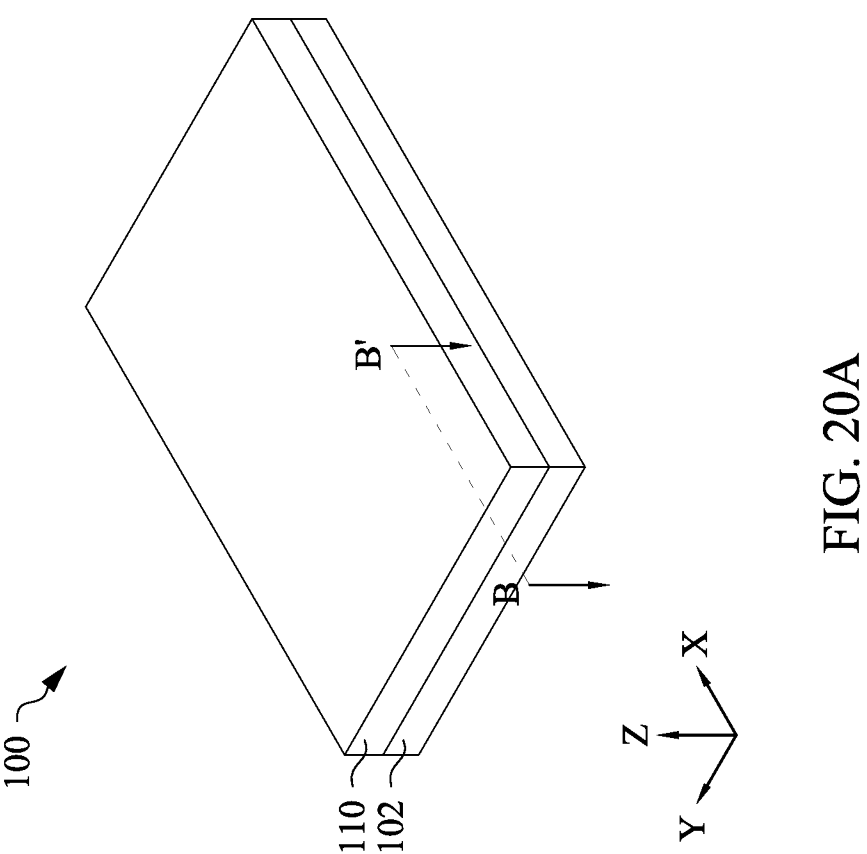
FIGS. 20A, 21A, 22A, 23A, 24A, 25A, 26A, 27A, 28A, 29A, 30A, and 31A illustrate perspective views of an example memory device during various fabrication stages of the method as shown in FIG. 19, in accordance with some embodiments.

Referring to FIGS. 19, 20A, and 20B, the method 300 at operation 302 forms a fourth dielectric layer 110 over the semiconductor substrate 102.

The semiconductor substrate 102 may include an elementary semiconductor material such as silicon, germanium, diamond, other elementary semiconductor material, a compound semiconductor material such as silicon germanium, silicon carbide, gallium arsenic, indium arsenide, indium phosphide, silicon germanium carbide, gallium arsenic phosphide, gallium indium phosphide, other compound semiconductor materials, or combinations thereof. A number of active/passive device features that collectively or respectively function as a logic circuit (e.g., transistors, capacitors, resistors, etc.) may be formed along a major surface of the semiconductor substrate 102.

In the present embodiments, the fourth dielectric layer 110 includes an insulating or dielectric material. For example, the fourth dielectric layer 110 may be an intermetal dielectric (IMD) layer and may include silicon oxide (SiO), silicon nitride (SiN), silicon oxynitride (SiON), dielectric material(s) with low dielectric constant (low-k) such as SiCOH, SiOCN, and/or SiOC, and/or a combination thereof. A low-k dielectric material is a dielectric material with a dielectric constant lower than about 3.9.

One or more IMD layers may be embedded with a number of interconnect structures (e.g., conductive lines, vias) to electrically connect them to device features formed over the semiconductor substrate 102. Such device features formed along the major surface of the semiconductor substrate 102 are typically referred to as part of front-end-of-line (FEOL) networking/processing, and those interconnect structures formed over the device features in the IMD layers are typically referred to as part of back-end-of-line (BEOL) networking/processing. In various embodiments, the memory device 100, as disclosed herein, may be formed within the BEOL networking.

Figure 21B:
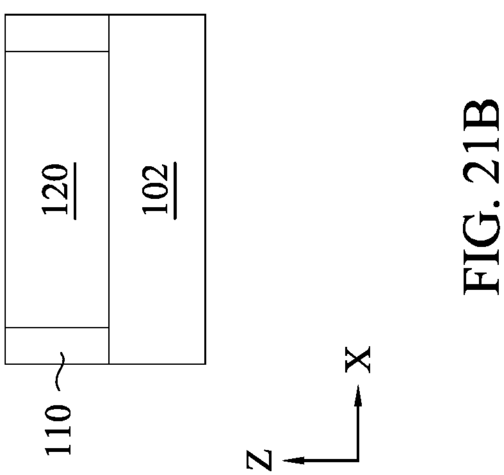
Figure 21A:
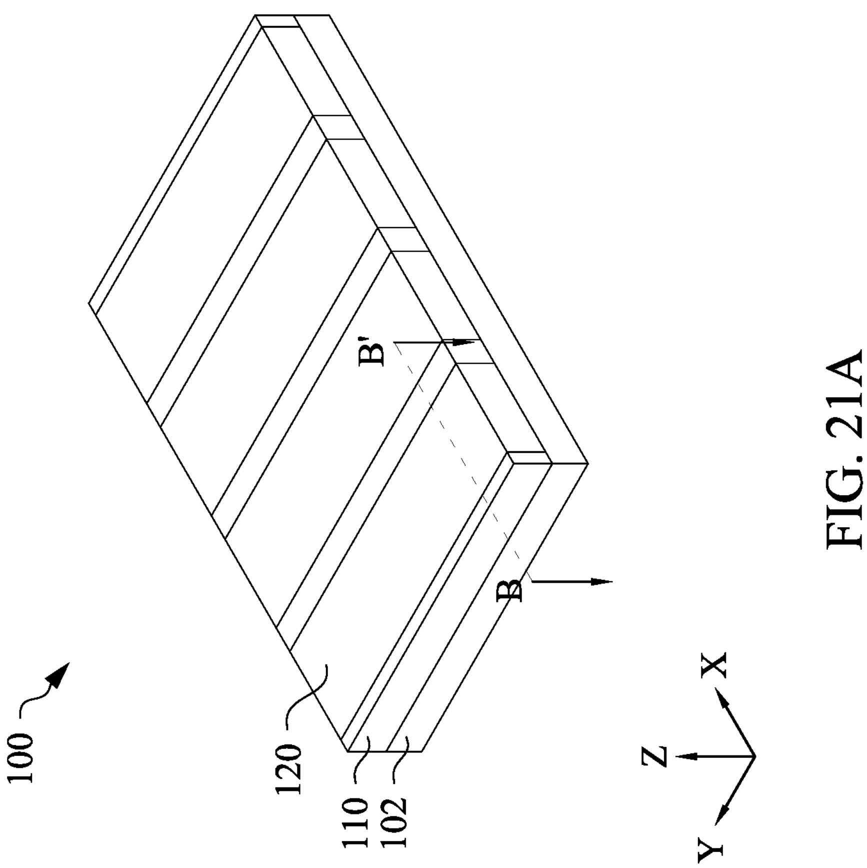

Referring to FIGS. 19, 21A, and 21B, the method 300 at operation 304 forms the WL structures 120 in the fourth dielectric layer 110.

In the present embodiments, forming the WL structures 120 includes forming WL trenches (not depicted) in the fourth dielectric layer 110, subsequently depositing a conductive layer in the WL trenches, and planarizing the conductive layer to form the WL structures 120. In the present embodiments, the WL trenches are formed to extend along a same lateral direction (e.g., the Y direction) and spaced apart from one another along another lateral direction (e.g., the X direction), i.e., the WL trenches are parallel, or substantially parallel, with each other. In the present embodiments, the WL trenches are formed to extend through a thickness of the fourth dielectric layer 110.

The WL trenches may be formed by a series of patterning and etching processes to remove portions of the fourth dielectric layer 110. For example, the WL trenches may be formed, for example, by depositing a masking layer (e.g., a photoresist) over the fourth dielectric layer 110, patterning the masking layer using a suitable lithography process (e.g., via photolithography, e-beam lithography, or any other suitable lithographic process) to form a patterned masking layer, and subsequently performing a series of etching processes to transfer the pattern on the patterned masking layer to the fourth dielectric layer 110. The etching process may include a plasma etching process, which can have a certain amount of anisotropic characteristic, a wet etching process, a reactive ion etching (RIE) process, other suitable processes, or combinations thereof. In other embodiments, a hard mask may first be patterned using the masking layer and the pattern be subsequently transferred to the fourth dielectric layer 110. After patterning the fourth dielectric layer 110, the patterned masking layer is removed by a suitable method, such as plasma ashing or resist stripping.

Subsequently, the method 300 at operation 302 deposits a conductive layer (e.g., the metal fill layer 186) over the fourth dielectric layer 110, thereby filling the WL trenches. The conductive layer may include copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), other suitable materials, or combinations thereof. The conductive layer may be formed by any suitable process, such as chemical vapor deposition (CVD), physical vapor deposition (PVD), atomic layer deposition (ALD), electroless plating, electroplating, or combinations thereof. Other material layers, such as an adhesive layer, may be formed in the WL trenches before depositing the conductive layer.

In some embodiments, portions of the conductive material are formed over a top surface of the fourth dielectric layer 110. Accordingly, a planarization process, such as a chemical-mechanical polishing/planarization (CMP) process, may be implemented to remove the excess portions from the top surface of the fourth dielectric layer 110, thereby forming the WL structure 120 in the fourth dielectric layer 110.

Figure 22B:
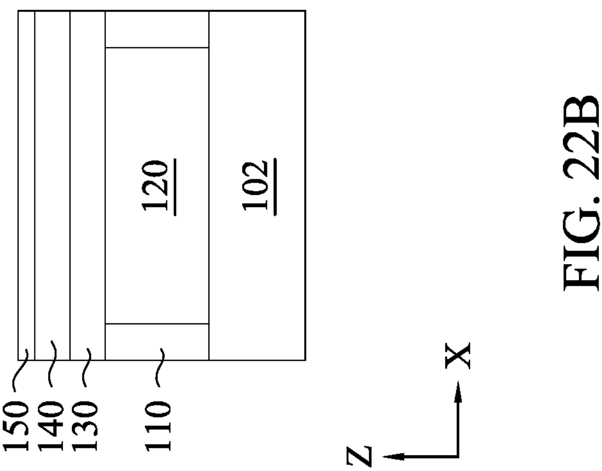
Figure 22A:
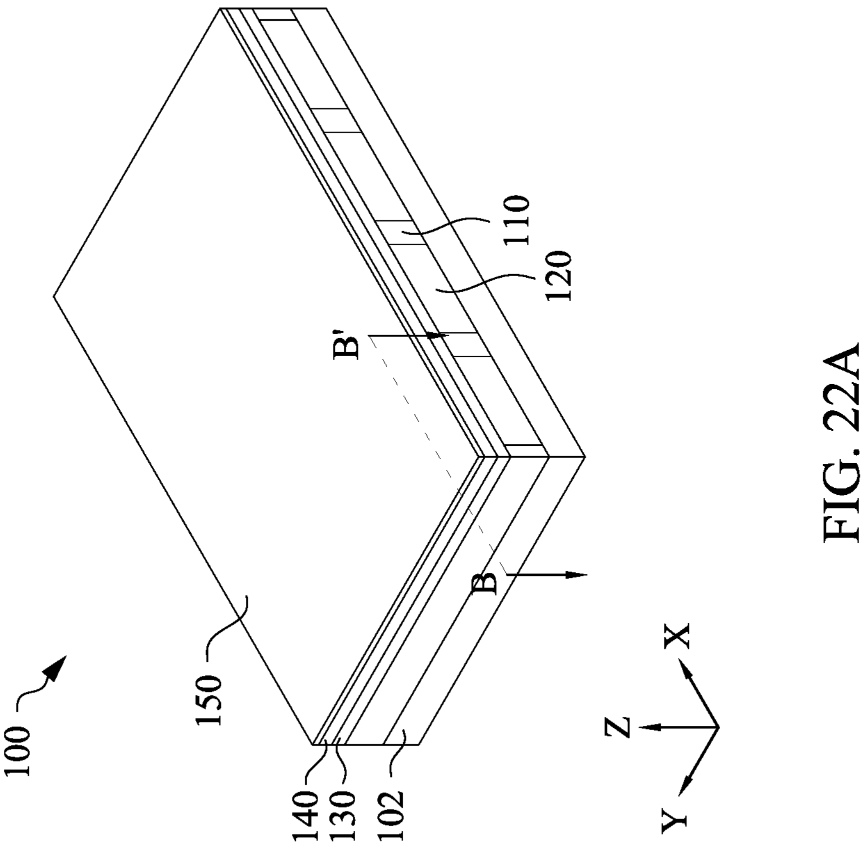

Referring to FIGS. 19, 22A, and 22B, the method 300 at operation 306 forms the ferroelectric layer 130 and the channel layer 140 over the WL structures 120.

The ferroelectric layer 130 and the channel layer 140 may be sequentially deposited over the WL structure 120 as a series of blanket layers using a suitable deposition process, such as CVD, PVD, ALD, other processes, or combinations thereof. Each of the ferroelectric layer 130 and the channel layer 140 may include a multi-layer structure, i.e., containing more than one sub-layer of corresponding material.

In the present embodiments, the ferroelectric layer 130 includes at least one ferroelectric material, such as hafnium oxide (e.g., hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (e.g., $BaTiO_3$ (BT)), colemanite (e.g., $Ca_2B_6O_{11}\cdot 5H_2O$), bismuth titanate (e.g., $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (e.g., $Pb(Sc_xTa_{1-x})O_3$), lead titanate (e.g., $PbTiO_3$ (PT)), lead zirconate titanate (e.g., $Pb(Zr,Ti)O_3$ (PZT)), lithium niobate (e.g., $LiNbO_3$ (LN), $LaAlO_3$), polyvinylidene fluoride $(CH_2CF_2)_n$, potassium niobate (e.g., $KNbO_3$), potassium sodium tartrate (e.g., $KNaC_4H_4O_6.4H_2O$), potassium titanyl phosphate (e.g., $KO_5PTi$), sodium bismuth titanate (e.g., $Na_{0.5}Bi_{0.5}TiO_3$ or $Bi_{0.5}Na_{0.5}TiO_3$), lithium tantalate (e.g., $LiTaO_3$ (LT)), lead lanthanum titanate (e.g., $(Pb,La)TiO_3$ (PLT)), lead lanthanum zirconate titanate (e.g., $(Pb,La)(Zr,Ti)O_3$ (PLZT)), ammonium dihydrogen phosphate (e.g., $NH_4H_2PO_4$ (ADP)), or potassium dihydrogen phosphate (e.g., $KH_2PO_4$ (KDP)). The ferroelectric layer 130 may be deposited by a suitable method, such as CVD, ALD, other methods, or combinations thereof. Other ferroelectric materials and deposition methods are within the scope of the present disclosure.

In the present embodiments, the channel layer 140 includes a doped or undoped semiconductor material such as, for example, Si (e.g., polysilicon or amorphous silicon), Ge, SiGe, silicon carbide (SiC), indium tungsten oxide (IWO), indium zinc oxide (IZO), indium tungsten zin oxide (IWZO), indium tin zinc oxide (ITZO), indium tin oxide (ITO), indium oxide (InO), indium gallium zinc oxide (IGZO), indium gallium oxide (IGO), other suitable materials, or combinations thereof. The channel layer 140 may be deposited over the semiconductor substrate 102 as a continuous liner structure, for example, by a conformal deposition method such as ALD or CVD. Other semiconductor materials and deposition methods are within the scope of the present disclosure.

Referring to FIGS. 19, 22A, 22B, 23A, and 23B, the method 300 at operation 308 forms and subsequently patterns the first dielectric layer 150 over the channel layer 140.

Figure 23B:
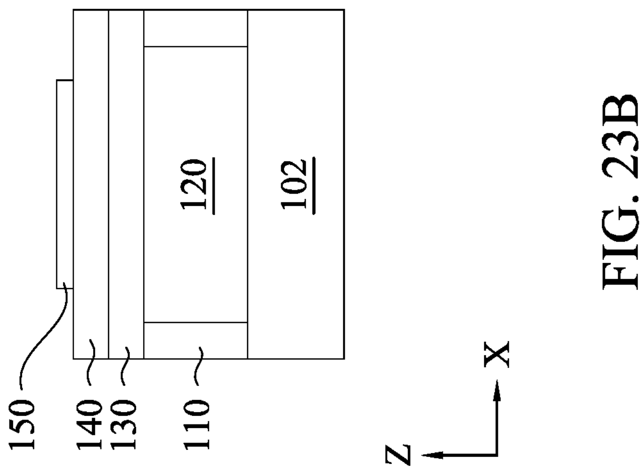
Figure 23A:
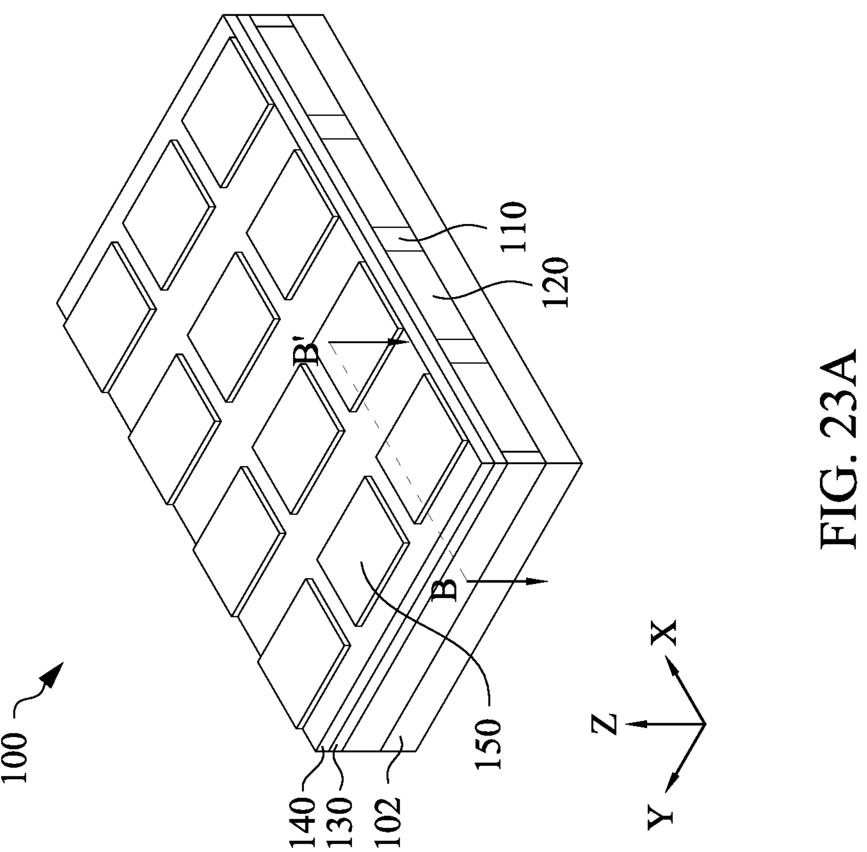

Referring to FIGS. 22A and 22B, the first dielectric layer 150 may be deposited over the channel layer 140 as a blanket layer using a suitable method, such as CVD, and may include one or more insulating materials similar to the fourth dielectric layer 110. Referring to FIGS. 23A and 23B, the first dielectric layer 150 is subsequently patterned to form portions isolated along both the X direction and the Y direction. Along the X direction, each isolated portion of the first dielectric layer 150 is disposed between portions of the fourth dielectric layer 110 and directly over the WL structure 120. The first dielectric layer 150 may be patterned by a series of lithography and etching processes similar to those discussed above with respect to patterning the fourth dielectric layer 110. In some embodiments, the operation 308 is optional, i.e., the method 300 may proceed from operation 306 to operation 310 directly.

Figure 24B:
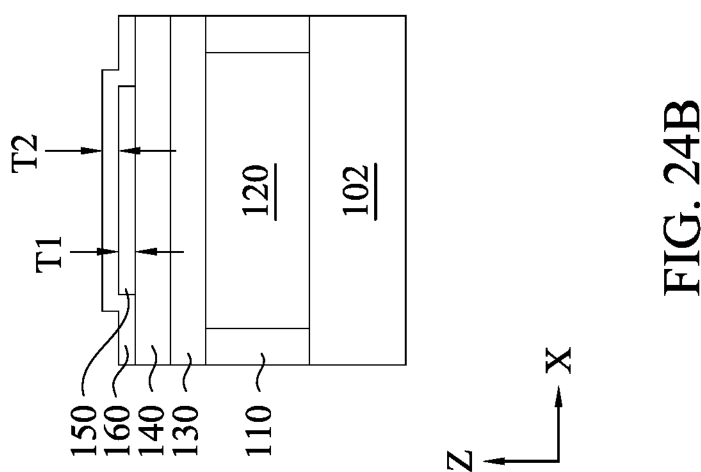
Figure 24A:
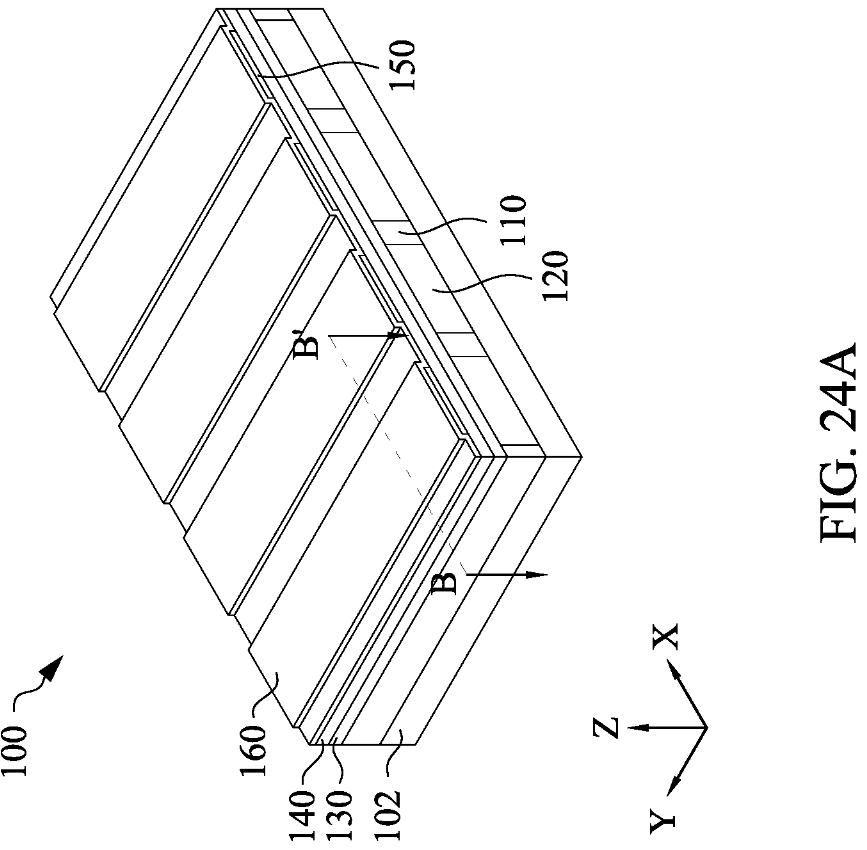

Referring to FIGS. 19, 24A, and 24B, the method 300 at operation 310 deposits the ESL 160 over the channel layer 140.

For embodiments in which the operation 308 performed, the ESL 160 is conformally deposited over the first dielectric layer 150 and the channel layer 140. Alternatively, for embodiments in which the operation 308 is omitted, referring to FIG. 12 as an example, the ESL 160 is deposited to directly contact the top surface of the channel layer 140. In this regard, the first dielectric layer 150 (or isolated portions thereof) is fully embedded by the ESL 160 and the channel layer 140. The ESL 160 may be deposited by any suitable conformal deposition method, such as CVD or ALD.

In the present embodiments, the ESL 160 is configured protect the surrounding components, such as the channel layer 140, from being over-etched during the formation of the SL structure 180 and the BL structure 182. In this regard, the ESL 160 has a composition different from that of the surrounding dielectric layers (e.g., the first dielectric layer 150 and the second dielectric layer 170) to ensure sufficient etching selectivity therebetween. As will be discussed in detail below, the ESL 160 is preferentially etched with respect to the first dielectric layer 150, such that the first dielectric layer 150 remains substantially intact over the channel layer 140. In some examples, the etching selectivity between the first dielectric layer 150 and the ESL 160 may be about 5 to about 50, i.e., an etching rate of the ESL 160 is about 5 times to about 50 times that of the first dielectric layer 150. Accordingly, a thickness T1 of the first dielectric layer 150 is greater than a thickness T2 of the ESL 160, and a ratio of Tl to T2 may be about 5 to about 50. In some examples, T1 may be about 5 nm to about 50 nm, and T2 may be about 1 nm to about 10 nm.

Figure 25B:
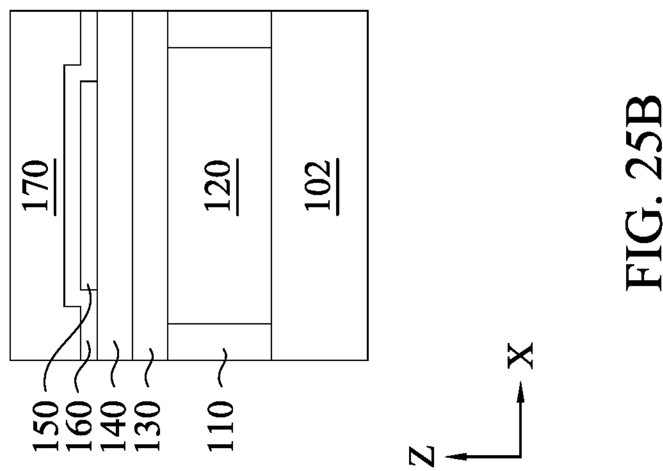
Figure 25A:
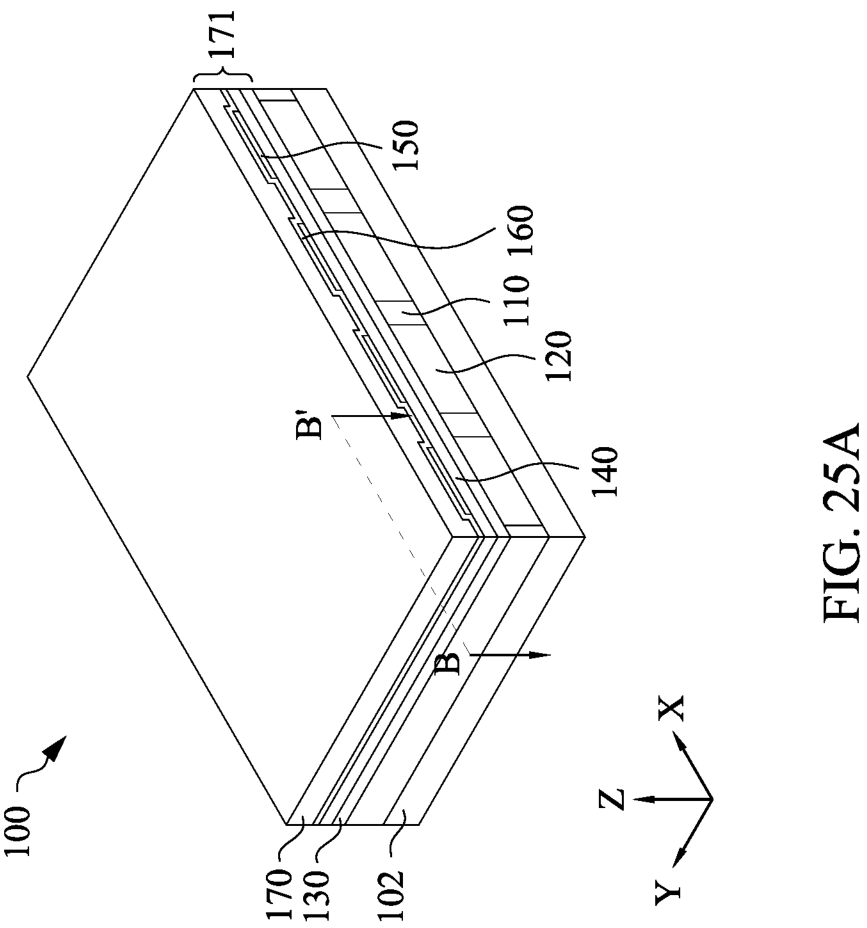

Referring to FIGS. 19, 25A, and 25B, the method 300 at operation 312 forms the second dielectric layer 170 over the ESL 160.

The second dielectric layer 170 may be deposited over the ESL 160 as a blanket layer using a suitable method, such as CVD, and may include one or more insulating materials similar to the fourth dielectric layer 110. In the present embodiments, the second dielectric layer 170 is considered an 1 MB layer in which the SL structure 180 and the BL structure 182 are formed. As a result, the second dielectric layer 170 is formed to a thickness that corresponds to a thickness (or height) of the SL/BL structures. The second dielectric layer 170, the ESL 160, and the channel layer 140 together may be referred to as a stack 171, which also includes the first dielectric layer 150 sandwiched between the ESL 160 and the channel layer 140.

Referring to FIGS. 19, 26A, and 26B, the method 300 at operation 314 cuts the stack 171 to form the memory cells 104 separated by trenches (or openings) 172.

In the present embodiments, various layers within the stack of the layers are patterned, concurrently or sequentially, to form discrete portions within each memory cell 104. For example, the stack of layers may be separated by dividing, cutting, or otherwise patterning each of the continuously extending second dielectric layer 170, ESL 160, and channel layer 140 into a plurality of discrete portions corresponding to the number of memory cells 104 in the memory device 100. These "cut" discrete portions are spaced apart from each other along the Y direction and along the X direction by forming the trenches 172.

The trenches 172 may be formed by a series of processes similar to the processes of patterning the fourth dielectric layer 110 as discussed in detail above including, for example, forming a patterned masking layer (e.g., a patterned photoresist) over the second dielectric layer 170 that at least exposes respective portions of the second dielectric layer 170 where the trenches 172 are located (or defined), and using the patterned masking layer to perform at least one etching process to remove the exposed portions of the stack 171. As such, each of the isolated (or cut) stack of layers may have its (e.g., four) sides surrounded by the trenches 172. After patterning the stack of layers, the patterned masking layer is removed by a suitable method, such as plasma ashing or resist stripping.

In some embodiments, the stack of layers is patterned such that the trenches 172 expose a top surface of the ferroelectric layer 130. In other words, the ferroelectric layer 130 remains substantially intact during the etching of the overlaying stack 171. Alternatively, as depicted in FIG. 9, the ferroelectric layer 130 may be etched with the stack 171 such that the trenches 172 extend through the ferroelectric layer 130 and isolate the ferroelectric layer 130 along with the overlaying stack of layers in each memory cell 104.

Figure 27B:
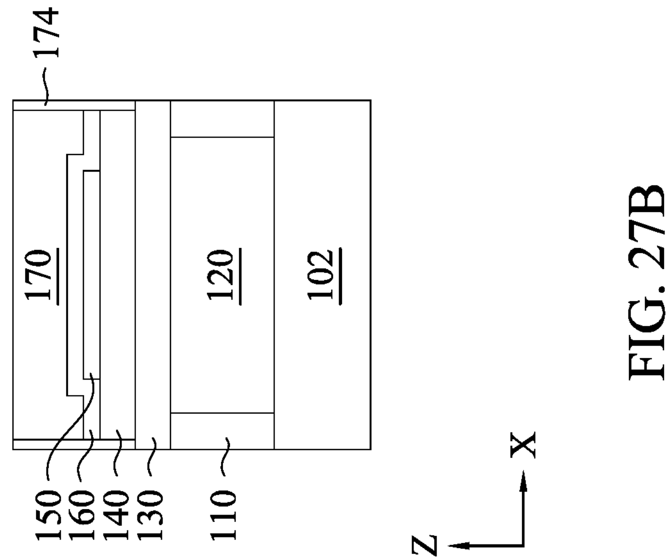
Figure 27A:
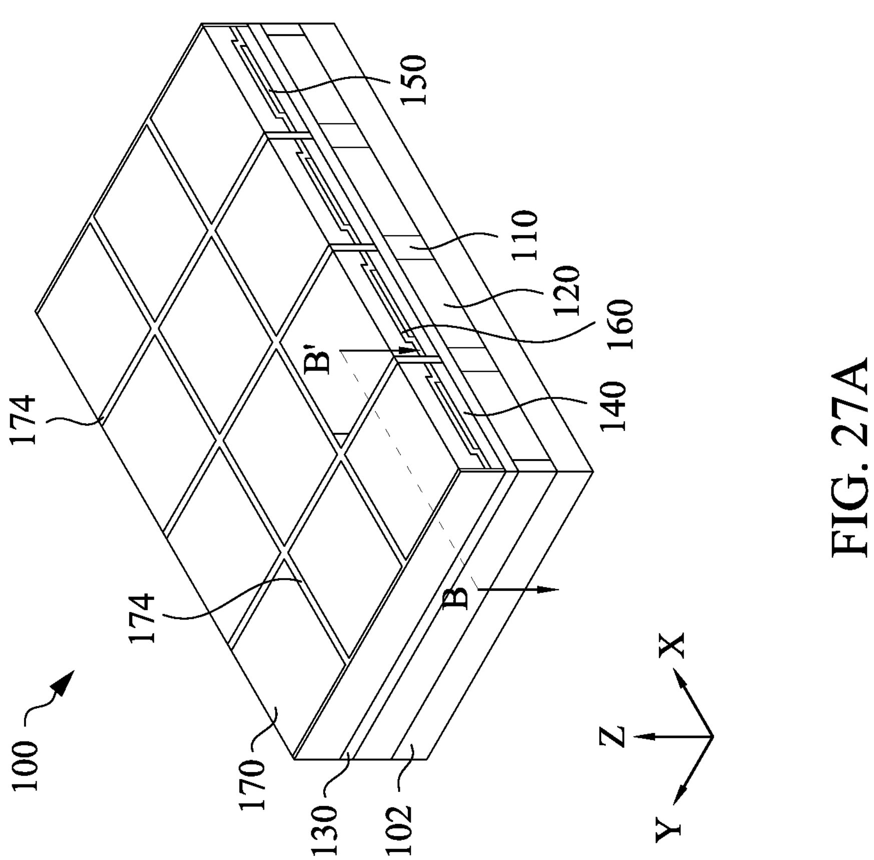

Referring to FIGS. 19, 27A, and 27B, method 300 forms the third dielectric layer 174 (i.e., the isolation structures) in the trenches 172 to isolate the memory cells 104.

In some embodiments, the third dielectric layer 174 may include a dielectric material similar to that of the fourth dielectric layer 110 and may be deposited by a suitable method, such as CVD or ALD. A CMP process may be implemented to remove excess material from a top surface of the second dielectric layer 170 after filling the trenches 172 with the third dielectric layer 174.

Figure 28B:
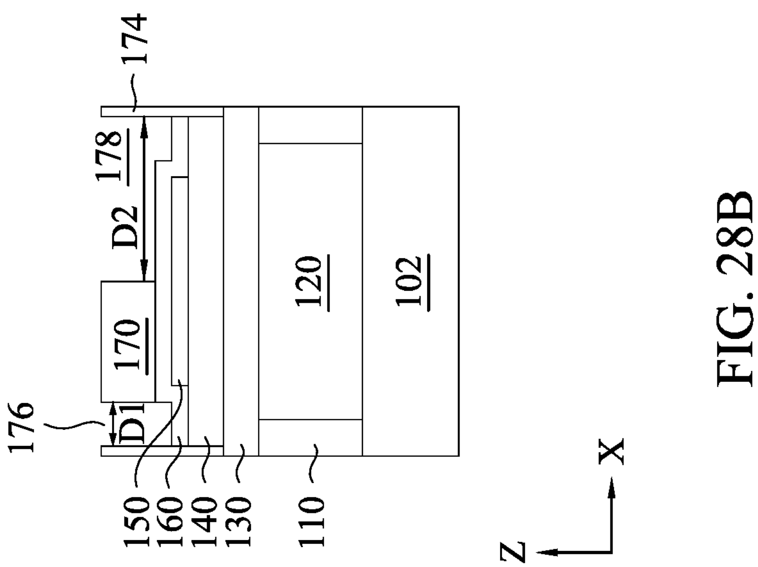
Figure 28A:
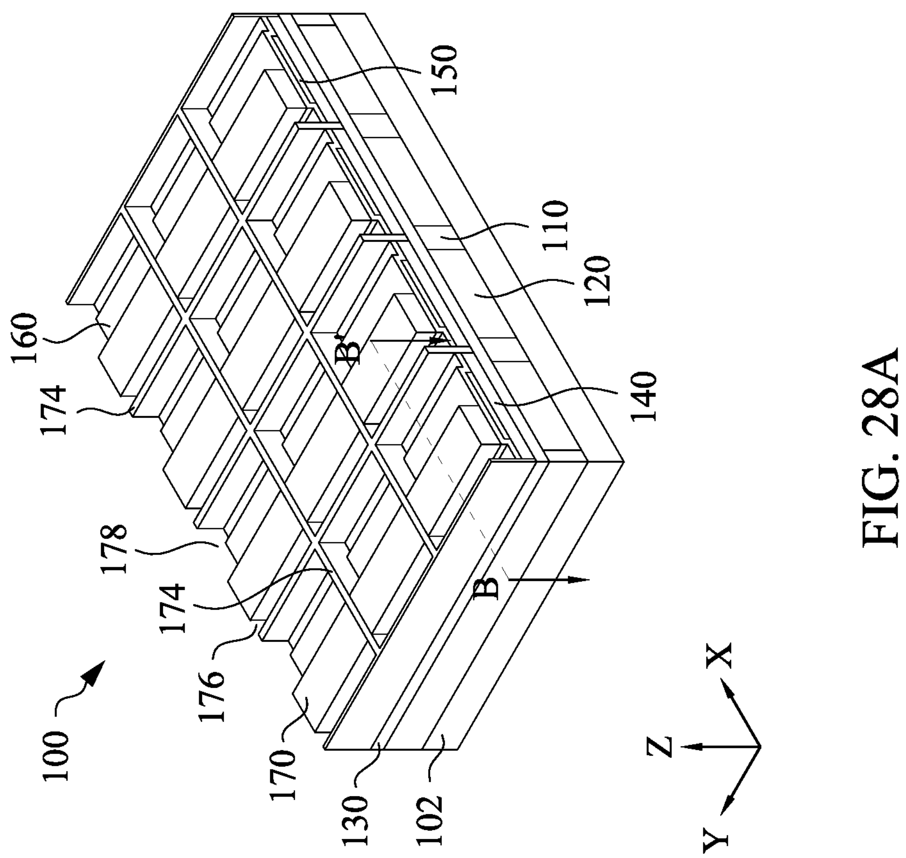

Referring to FIGS. 19, 28A, and 28B, the method 300 patterns the second dielectric layer 170 to form an opening 176 and an opening 178 to expose portions of the ESL 160 in each memory cell 104, where the opening 176 and 178 are configured with asymmetric dimensions.

The openings 176 and 178 may be formed by a series of processes similar to the processes of patterning the fourth dielectric layer 110 as discussed in detail above and may include, for example, forming a patterned masking layer (e.g., a patterned photoresist) over the second dielectric layer 170 and the third dielectric layer 174 that at least exposes respective portions of the second dielectric layer 170 where the openings 176 and 178 are located (or defined), and using the patterned masking layer to perform at least one etching process to remove the exposed portions of the second dielectric layer 170. In the present embodiments, the second dielectric layer 170 is selectively etched while the ESL 160 remains intact, or substantially intact. In this regard, each of the opening 176 and 178 exposes a portion of the ESL 160 and includes one sidewall defined by the third dielectric layer 174 and another sidewall defined by remaining portions of the second dielectric layer 170. After patterning the dielectric layer 170, the patterned masking layer is removed by a suitable method, such as plasma ashing or resist stripping.

In the present embodiments, the opening 176 is formed to the width D1, which corresponds to the width of the SL structure 180 (see FIG. 2A, for example), and the opening 178 is formed to the width D2, which corresponds to the width of the BL structure 182, where D2 is greater than D1. As such, the openings 176 and 178 (and the subsequently-formed SL and BL structures, respectively) are asymmetric in at least the dimension along the X direction.

Figure 29B:
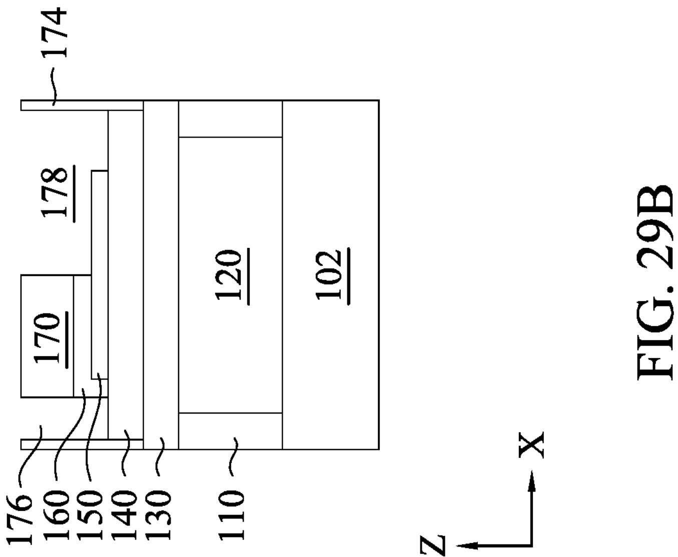
Figure 29A:
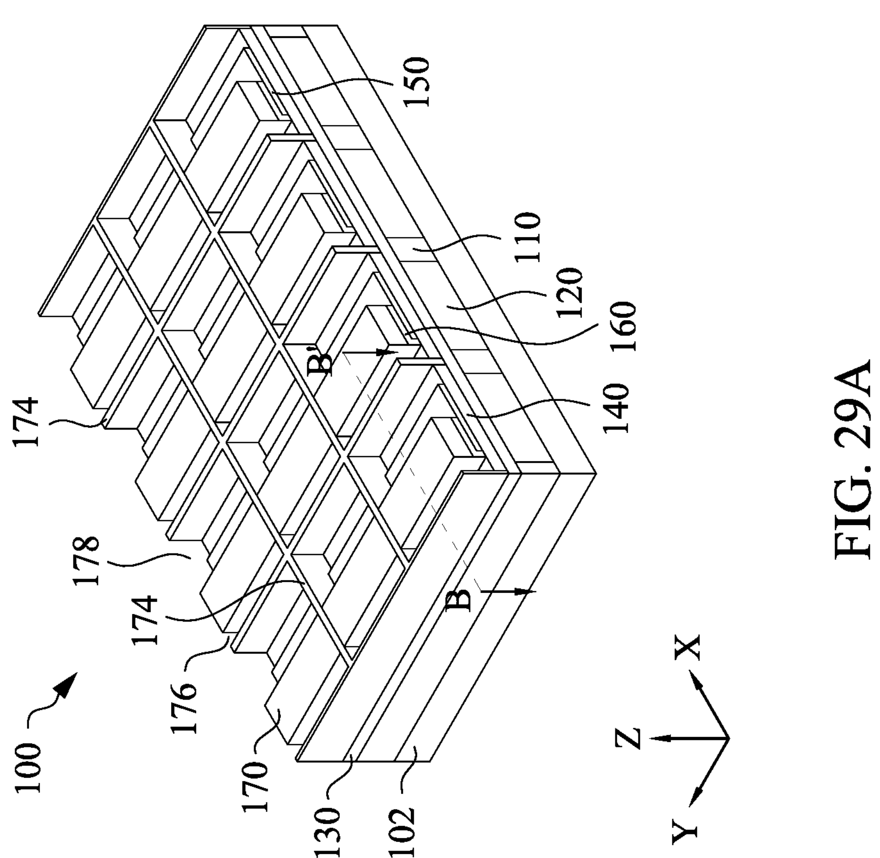

Referring to FIGS. 19, 29A, and 29B, the method 300 at operation 320 removes the portions of the ESL 160 exposed in the opening 176 and 178 to expose the underlying portions of the channel layer 140 and the first dielectric layer 150.

In the present embodiments, the method 300 implements a suitable etching process, such as a plasma etching process, a wet etching process, an RIE process, other etching processes, or combinations thereof, to selectively remove the exposed portions of the ESL 160 without removing, or substantially removing the first dielectric layer 150, the channel layer 140, and the third dielectric layer 174. As discussed in detail above, an etching selectivity of about 5 to about 50 exists between the first dielectric layer 150 (and the third dielectric layer 174) and the ESL 160, such that the ESL 160 is preferentially etched while the first dielectric layer 150 remains substantially intact.

As indicated in FIGS. 7 and 8, it is within the scope of the present disclosure to pattern the ESL 160 such that the opening 176 includes a portion that extends toward the opening 178 along the X direction. Accordingly, the resulting SL structure 180 may include the protruding portion 180' in addition to (see FIG. 7) or instead of (see FIG. 8) the BL structure 182 having the protruding portion 182'.

Figure 30B:
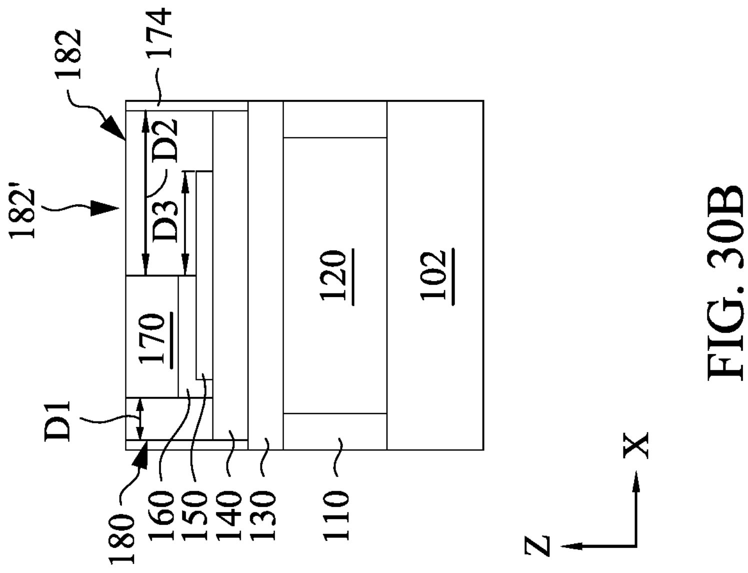
Figure 30A:
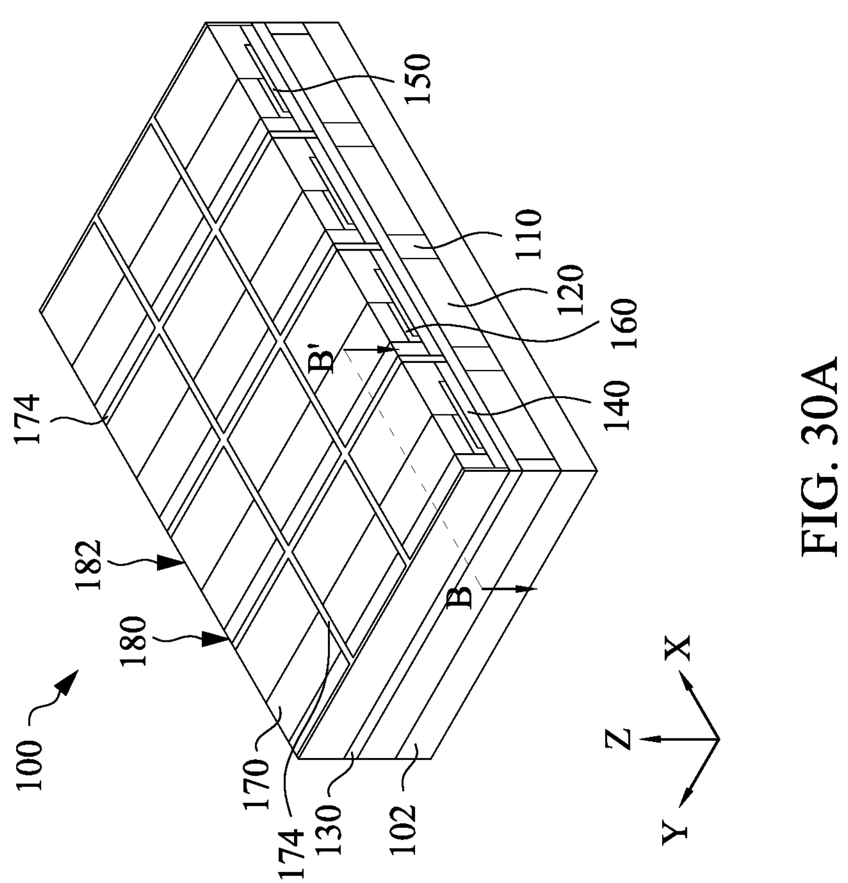

Referring to FIGS. 19, 30A, and 30B, the method 300 at operation 322 forms the SL structures 180 and the BL structures 182 in the openings 176 and 178, respectively.

In the present embodiments, each pair of the SL structure 180 and the BL structure 182 extend along the Y direction a length substantially equivalent to a length of the corresponding channel layer 140 of the same memory cell 104 along the Y direction. Furthermore, the asymmetric dimensions of the openings 176 and 178 result in the BL structure 182 to include the protruding portion 182' that extends toward the SL structure 180 along the X direction, where the protruding portion 182' is formed over a top surface of the first dielectric layer 150. In some embodiments, the SL structure 180 includes substantially parallel sidewalls without any protruding portion. In some embodiments, as depicted in FIGS. 7 and 8, the SL structure 180 includes the protruding portion 180' that extends toward the BL structure 182. Regardless whether both or only one of the SL structure 180 and BL structure 182 include a protruding portion, the present embodiments provide that a width of the SL structure 180 differs from that of the BL structure 182 along the X direction to achieve the asymmetric structure for enhanced ferroelectric property.

In the present embodiments, the SL structure 180 and the BL structure 182 each include a conductive layer, which may include copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), other suitable materials, or combinations thereof. The conductive layer may be formed by any suitable process, such as CVD, PVD, ALD, electroless plating, electroplating, or combinations thereof.

In some examples, referring to FIG. 13, prior to depositing the conductive layer, an adhesive layer (e.g., the adhesive layer 184) may be conformally formed in the openings 176 and 178 to enhance the adhesion between the fourth dielectric layer 110 and the conductive layer. In further examples, referring to FIG. 14, an ohmic contact layer (e.g., the ohmic contact layer 185) may be formed between the adhesive layer and the conductive layer.

Subsequently, one or more CMP processes may be performed to remove excess material formed over the second dielectric layer 170, thereby planarizing the SL structure 180 and the BL structure 182.

Figure 31B:
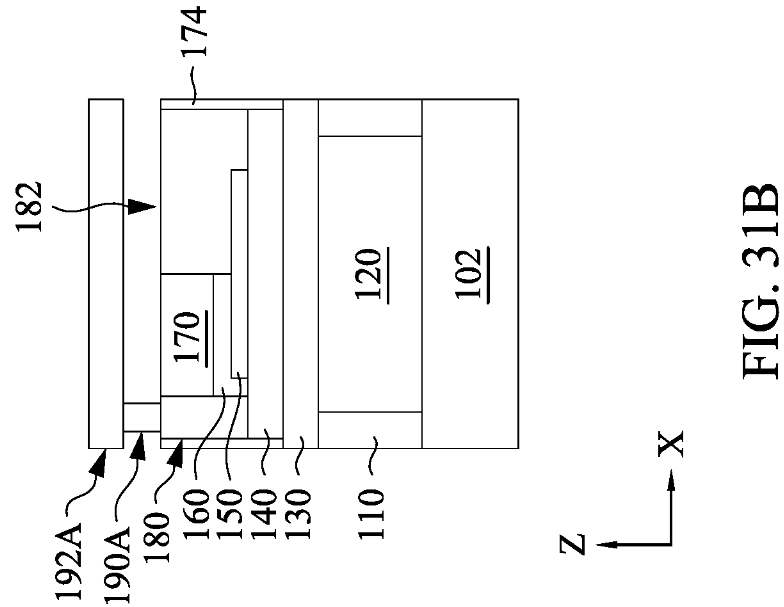
Figure 31A:
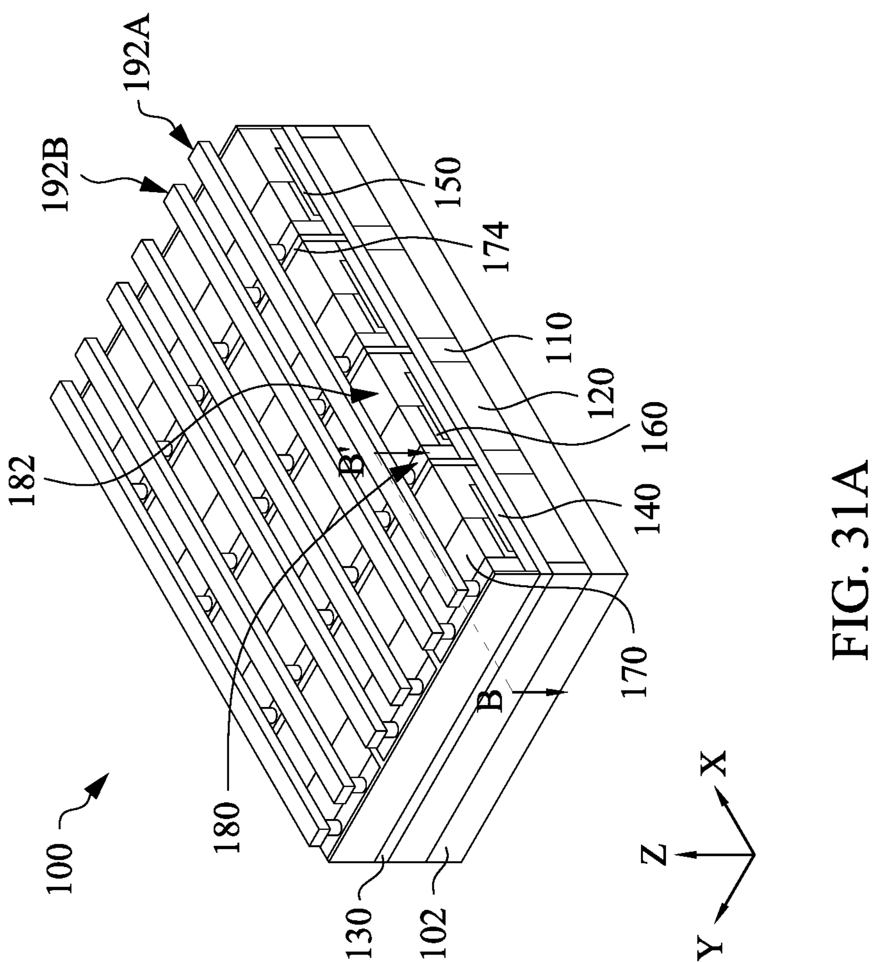

Referring to FIGS. 19, 31A, and 31B, the method 300 at operation 324 forms the interconnect structure 190A, 190B (as depicted in FIGS. 16-18), 192A, and 192B to provide electrical connects to the SL structures 180 and the BL structures 182.

In the present embodiments, the interconnect structures 190A and 190B are vias (i.e., vertical interconnect structures) configured to couple the SL structures 180 and the BL structure 182, respectively, with other interconnect structures, e.g., the interconnect structures 192A and 192B, respectively. The interconnect structures 192A and 192B are conductive lines (i.e., horizontal interconnect structures) configured to electrically couple all the SL structures 180 and all the BL structures 182, respectively. The interconnect structures 192A and 192B may extend along the X direction and are parallel with one another as shown in FIG. 31A. In some embodiments, the interconnect structures 192A and 192B may sometimes be referred to as a global SL and a global BL, respectively. The interconnect structures 190A, 190B, 192A, and 192B may each include a conductive material, such as copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), golden (Au), aluminum (Al), other suitable materials, or combinations thereof. The interconnect structures 190A, 190B, 192A, and 192B may each further include an adhesive layer or a barrier layer.

Though not depicted herein, the interconnect structures 190A, 190B, 192A, and 192B may be formed in multiple dielectric layers, such as IMD layers, similar to the dielectric layer 110. The horizontal interconnect structures and the vertical interconnect structures may be formed in separate damascene processes or together in a dual damascene process. A damascene process may generally include patterning the dielectric layer to form an opening (a hole for a via or a trench for a conductive line), depositing one or more conductive material in the opening, and performing a planarization process, such as a CMP process. The conductive material may be deposited by any suitable method, such as CVD, PVD, ALD, electroless plating, electroplating, or combinations thereof.

In one aspect of the present disclosure, a semiconductor device is disclosed. The semiconductor device includes a word line (WL) structure. The semiconductor device includes a ferroelectric layer over the WL structure. The semiconductor device includes a ferroelectric layer over the WL structure. The semiconductor device includes a source line (SL) structure over the channel layer. The semiconductor device includes a bit line (BL) structure over the channel layer. The BL structure includes a portion that laterally extends toward the SL structure. The semiconductor device further includes a dielectric layer laterally interposed between the SL structure and the BL structure.

In another aspect of the present disclosure, a semiconductor device is disclosed. The semiconductor device includes a plurality of ferroelectric memory cells arranged over a substrate. Each ferroelectric memory cell includes a word line (WL) structure; a ferroelectric layer over the WL structure; a channel layer over the ferroelectric layer; a first dielectric layer over the channel layer; a second dielectric layer partially extending over the first dielectric layer; a source line (SL) structure over the channel layer; a bit line (BL) structure over the channel layer and partially extending over the first dielectric layer toward the SL structure, where the second dielectric layer extends to contact a sidewall of each of the SL structure and the BL structure.

In yet another aspect of the present disclosure, a method for fabricating a memory devices is disclosed. The method includes forming a plurality of word line (WL) structures extending along a first lateral direction. The method includes forming a stack over the WL structures. The method includes isolating the stack to form a memory cell. The method includes etching the dielectric layer in each memory cell to form a first opening having a first width and a second opening having a second width along a second lateral direction perpendicular to the first lateral direction, where the second width is greater than the first width. The method further includes forming a source line (SL) structure in the first opening and a bit line (BL) structure in the second opening. Forming the stack includes: forming a ferroelectric layer over the WL structures; forming a channel layer over the ferroelectric layer; and forming a dielectric layer over the channel layer.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a word line (WL) structure;
a ferroelectric layer over the WL structure;
a channel layer over the ferroelectric layer;
a source line (SL) structure over the channel layer, wherein the SL structure has sidewalls parallel to each other and extending from a top surface of the SL structure to a bottom surface of the SL structure;
a bit line (BL) structure over the channel layer, wherein the BL structure includes a portion laterally extending toward the SL structure;
a first dielectric layer laterally interposed between the SL structure and the BL structure; and
a second dielectric layer laterally interposed between the SL structure and the BL structure, wherein the first dielectric layer is disposed between the channel layer and the second dielectric layers,
wherein a top surface of the portion of the BL structure is coplanar with the top surface of the SL structure and a top surface of the second dielectric layer.

2. The semiconductor device of claim 1, wherein the portion of the BL structure partially extends along a top surface of the first dielectric layer.

3. The semiconductor device of claim 2, wherein the first dielectric layer and the second dielectric layer differ in composition.

4. The semiconductor device of claim 2, wherein the second dielectric layer has a width shorter than a width of the first dielectric layer.

5. The semiconductor device of claim 2, wherein the second dielectric layer partially extends along the top surface of the first dielectric layer.

6. The semiconductor device of claim 1, wherein the ferroelectric layer includes a multi-layer structure.

7. The semiconductor device of claim 1, wherein the first portion of the BL structure is physically separated from the channel layer.

8. A semiconductor device, comprising:
a ferroelectric memory cell, including:
a word line (WL) structure;
a ferroelectric layer over the WL structure;
a channel layer over the ferroelectric layer;
a first dielectric layer over the channel layer;
an etch-stop layer over a portion of the first dielectric layer;
a second dielectric layer over the etch-stop layer, wherein the second dielectric layer has a composition different from the etch-stop layer;
a source line (SL) structure over the channel layer; and
a bit line (BL) structure over the channel layer and partially extending over the first dielectric layer toward the SL structure, wherein the second dielectric layer extends to contact a sidewall of each of the SL structure and the BL structure, and
wherein a top surface of the second dielectric layer, a top surface of the SL structure, and a top surface of the BL structure are coplanar with each other.

9. The semiconductor device of claim 8, wherein the second dielectric layer is disposed between the SL structure and the BL structure such that the SL structure is physically separated from the BL structure.

10. The semiconductor device of claim 8, wherein the first dielectric layer directly contacts a top surface of the channel layer.

11. The semiconductor device of claim 8, wherein the ferroelectric memory cell is a first ferroelectric memory cell, the semiconductor device further comprising a second ferroelectric memory cell adjacent to the first ferroelectric memory cell along a first direction, wherein the first ferroelectric memory cell has a first orientation and the second ferroelectric memory cell has the first orientation.

12. The semiconductor device of claim 8, further comprising a first via electrically connected to the SL structure and a second via electrically connected to the BL structure, the first via having a first cross-sectional area and the second via having a second cross-sectional area, wherein the first cross-sectional area is less than the second cross-sectional area.

13. The semiconductor device of claim 8, wherein at least one of the SL structure and the BL structure extends over a sidewall of the channel layer.

14. The semiconductor device of claim 8, wherein the channel layer has a width smaller than a width of the ferroelectric layer.

15. The semiconductor device, comprising:

a word line (WL) structure on a semiconductor substrate;

a ferroelectric layer over the WL structure;

a channel layer over the ferroelectric layer;

a source line (SL) structure over the channel layer;

a bit line (BL) structure over the channel layer;

a first dielectric layer laterally interposed between the SL structure and the BL structure and disposed over the channel layer;

a second dielectric layer laterally interposed between the SL structure and the BL structure, wherein the second dielectric layer extends over a portion of the first dielectric layer;

a third dielectric layer disposed adjacent to the BL structure and over the ferroelectric layer; and a fourth dielectric layer disposed adjacent to the WL structure and between the ferroelectric layer and the semiconductor substrate, wherein a top surface of the third dielectric layer, a top surface of the SL structure and a top surface of the BL structure are coplanar with a top surface of the second dielectric layer.

16. The semiconductor device of claim 15, wherein one of the BL structure and the SL structure includes a portion extending toward the other.

17. The semiconductor device of claim 15, wherein a portion of the BL structure or a portion of the SL structure partially extends along a top surface of the first dielectric layer.

18. The semiconductor device of claim 15, further comprising an etch-stop layer over the first dielectric layer, wherein the etch-stop layer includes a portion that extends along a sidewall of the first dielectric layer.

19. The semiconductor device of claim 15, wherein the first dielectric layer and the second dielectric layer differ in composition.

20. The semiconductor device of claim 15, wherein the third dielectric layer directly contacts a sidewall of the SL structure.

* * * * *